(12) United States Patent
Iijima et al.

(10) Patent No.: US 8,649,741 B2
(45) Date of Patent: Feb. 11, 2014

(54) RADIO FREQUENCY MODULE HAVING AN ISOLATION MODE BETWEEN TRANSMISSION MODE AND POWER SAVING MODE

(75) Inventors: Masanori Iijima, Kawasaki (JP); Yoshiaki Harasawa, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 368 days.

(21) Appl. No.: 13/204,400

(22) Filed: Aug. 5, 2011

(65) Prior Publication Data

US 2012/0064952 A1 Mar. 15, 2012

(30) Foreign Application Priority Data

Sep. 14, 2010 (JP) ................................. 2010-205951

(51) Int. Cl.
*H04B 1/44* (2006.01)
(52) U.S. Cl.
USPC ........................... 455/83; 455/127.1; 333/103
(58) Field of Classification Search
USPC .............. 455/78, 80, 82, 83, 550.1, 571, 572, 455/573, 127.1; 333/101, 102, 103
See application file for complete search history.

(56) References Cited

U.S. PATENT DOCUMENTS

| 6,804,502 | B2 | 10/2004 | Burgener et al. | |
|---|---|---|---|---|
| 7,738,842 | B2 * | 6/2010 | Yoon | 455/83 |
| 7,838,914 | B2 | 11/2010 | Yamane et al. | |
| 2007/0232241 | A1 * | 10/2007 | Carley et al. | 455/83 |
| 2012/0083224 | A1 * | 4/2012 | Visser et al. | 455/83 |

* cited by examiner

*Primary Examiner* — Thanh Le
(74) *Attorney, Agent, or Firm* — Womble Carlyle

(57) ABSTRACT

A radio frequency module is configured to enter a power saving mode with high reliability. The radio frequency module includes, e.g., a first switch transistor for coupling a transmission node to an antenna, a second switch transistor for shunting the transmission node to a ground voltage, and a level shift circuit for performing on-off control of the first and second switch transistors by positive and negative power supply voltages. The level shift circuit, upon receiving a sleep instruction while the module is in a transmission operation mode in which the first switch transistor for coupling a transmission node to an antenna is turned on and the second switch transistor for shunting the transmission node to a ground voltage is turned off, first transitions to an isolation operation mode in which the first switch transistor for coupling a transmission node to an antenna is turned off and the second switch transistor for shunting the transmission node to a ground voltage is turned on for a first period of time, and then transitions to a sleep mode in which the positive and negative power supply voltages are deactivated.

22 Claims, 21 Drawing Sheets

FIG. 14

| Mode | | ANTCTL in (BBU out) | | | ANTCTL out | | | | | LSBK out | | | | | | |
|---|---|---|---|---|---|---|---|---|---|---|---|---|---|---|---|---|
| | | TX_EN | TX_SW_EN | BAND | VSW | Sc | Sb | Sa | TX LBT | TX LBS | TX HBT | TX HBS | RX HBT | RX HBS | RX LBT | RX LBS |
| A | SLPMD | 0 | 0 | 0 | 0 | 0 | 0 | 0 | HiZ | HiZ | HiZ | HiZ | HiZ | HiZ | HiZ | HiZ |
| B | LB ISOMD | 1 | 0 | 0 | 1 | 0 | 0 | 0 | L | H | L | H | L | H | L | H |
| C | TXMD1(LB) | 1 | 1 | 0 | 1 | 0 | 0 | 1 | H | L | L | H | L | H | L | H |
| D | HB ISOMD | 1 | 0 | 1 | 1 | 0 | 0 | 0 | L | H | L | H | L | H | L | H |
| E | TXMD2(HB) | 1 | 1 | 1 | 1 | 0 | 1 | 0 | L | H | H | L | L | H | L | H |
| F | RXMD2(HB) | 0 | 1 | 1 | 1 | 1 | 0 | 0 | L | H | L | H | H | L | H | H |
| G | RXMD1(LB) | 0 | 1 | 0 | 1 | 0 | 1 | 1 | L | H | L | H | L | H | H | L |
| H | ISOMD(Idle) | 0 | 0 | 1 | 1 | 0 | 0 | 0 | L | H | L | H | L | H | L | H |

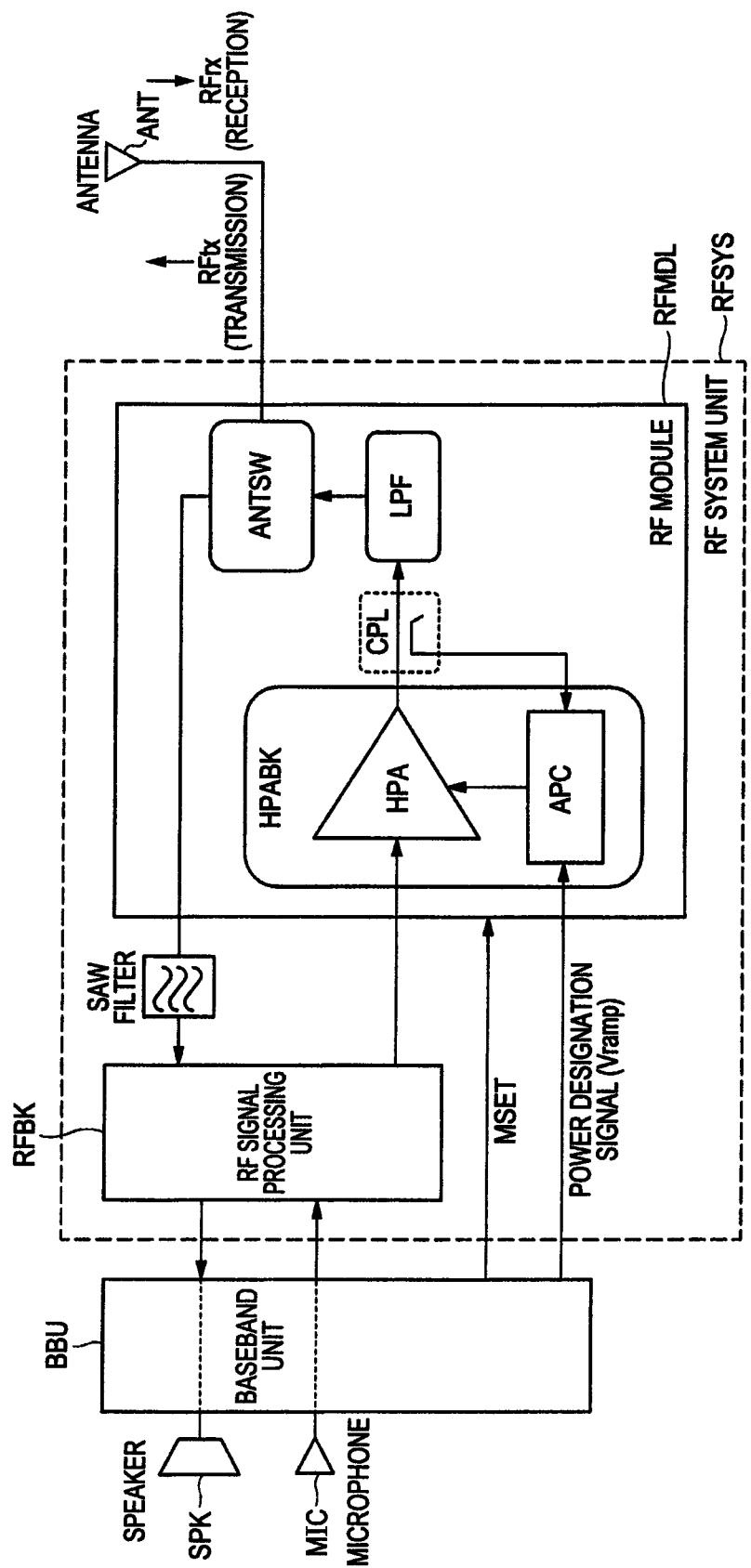

RADIO FREQUENCY MODULE HAVING AN ISOLATION MODE BETWEEN TRANSMISSION MODE AND POWER SAVING MODE

CROSS-REFERENCE TO RELATED APPLICATIONS

The disclosure of Japanese Patent Application No. 2010-205951 filed on Sep. 14, 2010 including the specification, drawings and abstract is incorporated herein by reference in its entirety.

BACKGROUND

The present invention relates to a radio frequency module including an antenna switch circuit, and in particular, relates to a technique effective when applied to a radio frequency module for wireless communication having a power saving function.

For example, U.S. Pat. No. 6,804,502 describes an RF switch circuit using a MOSFET (Metal Oxide Semiconductor Field Effect Transistor) over an SOI (Silicon on Insulator) substrate. The MOSFET is turned on and off by using control signals of positive and negative voltages. Further, Japanese Unexamined Patent Publication No. 2005-159157 describes a configuration in which a switching element in a radio frequency module is formed with an HEMT element.

SUMMARY

In wireless communication devices typified by a cellular phone, there is widely used a radio frequency module (RF module) which includs a radio frequency switch circuit for controlling the coupling between an antenna and transmission and reception circuits and a radio frequency power amplifier circuit (power amplifier circuit) which is a part of the transmission circuit and outputs a radio frequency signal to the radio frequency switch circuit. The radio frequency switch circuit is needed in switching between transmission and reception in the case of using TDD (Time Division Duplex) such as GSM (Global System for Mobile Communication) and in selecting each band in the so-called multi-band cellular phone which supports multiple bands including W-CDMA (Wideband Code Division Multiplex Access). Such a radio frequency module may particularly require size and power in a wireless communication device; accordingly, there is a great need for smaller size and lower power consumption in addition to communication performance.

FIG. 20A is a circuit diagram showing the configuration of a radio frequency switch circuit and peripherals in a radio frequency module examined as a premise of the present invention, and FIG. 20B is an explanatory diagram showing an operation example during transmission in FIG. 20A. The radio frequency switch circuit RFSW shown in FIG. 20A includes, for example, four switch transistors TSW1 to TSW4. One end of the transistor TSW2 and one end of the transistor TSW3 are coupled in common to an antenna ANT. The other end of the transistor TSW2 is coupled to one end of the transistor TSW1, and the other end of the transistor TSW3 is coupled to one end of the transistor TSW4. The other end of the transistor TSW1 and the other end of the transistor TSW4 are coupled to a ground voltage GND (0 V). A switch control circuit SWCTL performs on-off control of the transistors TSW1 to TSW4, using control signals OUT1, OUT1B, OUT2B, OUT2, respectively.

During transmission, the transistors TSW2 and TSW4 are turned on, and the transistors TSW1 and TSW3 are turned off, so that a radio frequency signal from a transmission node TX is sent through a coupling capacitor Ctx and the transistor TSW2 to the antenna ANT. At this time, since the transistor TSW4 is turned on, a coupling node N11 between the transistors TSW3 and TSW4 is coupled to the ground GND with low impedance. Therefore, even if the radio frequency signal sent to the antenna ANT leaks through the turned-off transistor TSW3 (e.g., an off-capacitance between the source and the drain), the leakage signal can be reflected off the node N11. On the other hand, during reception, the transistors TSW1 and TSW3 are turned on, and the transistors TSW2 and TSW4 are turned off, so that a radio frequency signal received by the antenna ANT is sent through the transistor TSW3 and a coupling capacitor Crx to a reception node RX. At this time, since the transistor TSW1 is turned on, a coupling node N10 between the transistors TSW1 and TSW2 is coupled to the ground GND with low impedance. Therefore, even if the radio frequency signal received by the antenna ANT leaks through the turned-off transistor TSW2 (e.g., an off-capacitance between the source and the drain), the leakage signal can be reflected off the node N10.

Further, for example during transmission, the coupling node N10 is biased to 0 V through a high resistance element (not shown) between the source (s) and the drain (d) of the transistor TSW1; accordingly, an amplitude of a transmission radio frequency signal RFtx of a few volts across 0 V is generated at the node N10 as shown in FIG. 20B. If the threshold voltage of the transistor TSW1 is nearly 0 V, and the control signal OUT1 (gate voltage) to the gate (g) of the transistor TSW1 is 0 V (i.e., the transistor TSW1 is in a shallow off state), the transistor TSW1 may be turned on erroneously with a negative voltage at the node N10, which may cause waveform distortion (clip to GND) of the signal RFtx. Further, the transistor TSW3 which is turned off during transmission may be turned on erroneously due to a similar phenomenon. This may also cause waveform distortion of the signal RFtx and a reduction in isolation characteristics on the receiving side. The waveform distortion of the signal RFtx includes harmonic distortion, which can interfere with other communication devices. To prevent such a situation, it is necessary to have a mechanism for controlling the transistors TSW1 to TSW4 into a deep off state at the time of turning off the transistors TSW1 to TSW4.

The mechanism for achieving the deep off state includes, for example, a method of using a booster circuit and a method of using a negative voltage. FIG. 21 is a circuit diagram showing a detailed configuration example of the circuit in FIG. 20A by way of example of the method of using a booster circuit. FIG. 22 is a sectional view showing a device structure example of each switch transistor in FIG. 21. In a radio frequency switch circuit RFSWa shown in FIG. 21, the four switch transistors TSW1 to TSW4 are configured with transistors HT1 to HT4 formed of pHEMT (pseudomorphic High Electron Mobility Transistor) elements, respectively. As shown in FIG. 22, a pHEMT element has a structure in which, for example, a channel layer CH is formed over a semiconductor substrate SUB such as GaAs, a gate electrode GT is formed over the layer CH, and a source electrode SC and a drain electrode DR are formed through an interlayer film LY and a cap layer CAP over the layer CH on opposite sides of the electrode GT. The layer CH has a structure in which, for example, an electron supply layer such as $n^+$-AlGaAs is laminated over an electron transit layer such as InGaAs, and the film LY and the layer CAP are formed of, for example, $n^+$-GaAs.

The pHEMT element has a relatively high device breakdown voltage. Accordingly, in the example of FIG. 21, a booster circuit VBST is provided between the transmission node TX and the gate of the transistor HT2, and drives the transistors HT1 and HT3 which are turned off during transmission into a deep off state. Specifically, during transmission, a driver circuit DV10 in an antenna control circuit ANTCTL outputs an 'H' level to a node N12, and a driver circuit DV11 outputs an 'L' level to a node N13. The circuits DV10 and DV11 operate at a power supply voltage VSW (e.g., about 3 V) and the ground voltage GND (0 V), so that the 'H' level is about 3 V, and the 'L' level is 0 V. When the voltage (about 3 V) at the node N12 is applied through a resistive element to the gate of the transistor HT2, the circuit VBST boosts the voltage between both ends of the resistive element, and the boosted voltage is applied to the gate of the transistor HT2.

In the circuit VBST, when the radio frequency signal RFtx to the transmission node TX is a negative voltage, a diode Db1 is turned on and a diode Db2 is turned off, so that negative charge is stored on the Db1 side of a capacitor Cb2. On the other hand, when the signal RFtx is a positive voltage, the diode Db1 is turned off and the diode Db2 is turned on, so that positive charge is stored on the Db2 side of the capacitor Cb2. Accordingly, with repetitive positive and negative voltages of the signal RFtx, the voltage (e.g., about 6 V) obtained by boosting the voltage (about 3 V) at the node N12 is generated on the Db2 side of the capacitor Cb2 and applied to the gate of the transistor HT2. At this time, the boosted voltage is applied to the source (and the drain coupled thereto through a high resistance element) of the transistor HT1, and also applied to the source (and the drain coupled thereto through a high resistance element) of the transistor HT3 through a forward Schottky junction between the gate and the source (drain) of the transistor HT2. Since the gate of the transistor HT1 is coupled to the ground GND, the potential difference between the gate and the source is, for example, about −6.0 V, so that the transistor HT1 is driven into a deep off state. Since the gate of the transistor HT3 is driven to 0 V at the node N13, and the source is driven to, for example, about 5.3 V through the forward voltage drop of the Schottky junction, the potential difference between the gate and the source is about −5.3 V, so that the transistor HT3 is driven into a deep off state.

However, the radio frequency switch circuit RFSWa obtained by combining these pHEMT elements and the booster circuit is not suitable for reducing the size and cost of the radio frequency module. That is, the pHEMT element has the special device structure as shown in FIG. 22, and is therefore difficult to integrate with a common circuit typified by the MOSFET, which prevents a reduction in size and requires a relatively high manufacturing cost. For this reason, it can be considered that a radio frequency switch circuit is achieved, for example, with the MOSFET over an SOI substrate which is advantageous to integration and lower cost. However, the MOSFET generally has a lower device breakdown voltage than the pHEMT element; therefore, it is undesirable to adopt the method of using the booster circuit. For this reason, in the case of the MOSFET, it is desirable to drive the MOSFET into a deep off state by applying a negative voltage to the gate in combination with a negative voltage generation circuit.

However, using the method of the negative voltage may cause a new problem in power saving control. Since the RF module is required to have lower power consumption as described above, it is desirable to operate the RF module, e.g., in a power saving operation mode (sleep mode) during a period of no transmission or reception. For example, in FIG. 20A, it is necessary to sufficiently secure isolation characteristics between the transmission node TX and the antenna ANT so as not to emit undesired radio waves from the antenna ANT during the sleep mode. On the other hand, it is necessary to stop the generation and supply of the power supply voltage for sufficient power saving by the mode.

In the configuration example shown in FIG. 21, by outputting the 'L' level (GND level) from the antenna control circuit ANTCTL by some means during the sleep mode, it is possible to turn on the transistor HT1 (TSW1 in FIG. 20A) which is the pHEMT element of a depression type for example. As a result, since the transmission node TX can be biased to the ground GND, it is possible to secure isolation characteristics. However, in the case of using the method of the negative voltage, since the operation of the negative voltage generation circuit for setting the 'L' level is stopped, the gate level of the transistor TSW1 in FIG. 20A becomes indefinite. Although details will be described later, in reality the gate level can become high impedance or the like, which may inhibit the transistor TSW1 from being turned on, and consequently may cause a reduction in isolation characteristics.

The present invention has been made in view of such a circumstance, and it is an object of the invention to provide a radio frequency module that can implement a power saving mode of high reliability. The above and other objects and novel features of the present invention will become apparent from the description of this specification and the accompanying drawings.

A typical embodiment of the invention disclosed in the present application will be briefly described as follows.

A radio frequency module according to this embodiment includes a power amplifier circuit, first and second transistors, and first control circuitry. The power amplifier circuit amplifies a transmission radio frequency signal and outputs the amplified signal to a transmission node. The first transistor couples the transmission node to an antenna, and the second transistor shunts the transmission node to a first power supply voltage. The first control circuitry generates a second power supply voltage higher than the first power supply voltage and a third power supply voltage lower than the first power supply voltage and performs on-off control of the first and second transistors by applying a control signal having a value of the second power supply voltage or the third power supply voltage to the first and second transistors. When a transmission operation mode is designated, the first control circuitry turns on the first transistor and turns off the second transistor, and when a power saving operation mode is designated after the transmission operation mode, the first control circuitry turns off the first transistor and turns on the second transistor during a first time period and then stops generation of the second and third power supply voltages.

This makes it possible to maintain the off state of the first transistor and the on state of the second transistor in the power saving operation mode in which the second and third power supply voltages become indefinite, thereby making it possible to enhance isolation characteristics. As a result, it becomes possible to achieve the power saving operation mode of high reliability.

According to an effect of the typical embodiment of the invention disclosed in the present application, it is possible to achieve the power saving operation mode of high reliability in the radio frequency module.

BRIEF DESCRIPTION OF THE DRAWINGS

FIG. 14 is a truth table showing a detailed operation example of a control logic circuit in the antenna control circuit shown in FIG. 12.

FIGS. 15A and 15B show a characteristic operation example extracted in association with FIG. 14, in which FIG. 15A is a state transition diagram, and FIG. 15B is an operation waveform chart.

FIGS. 17A and 17B show actual transition examples of an output voltage in the level shift circuit shown in FIG. 16, in which FIG. 17A shows the case of using the operation example shown in FIG. 1, and FIG. 17B shows the case of using the operation example shown in FIG. 2 as a comparison example.

FIG. 18 is a block diagram showing a configuration example of a wireless communication system employing the radio frequency module according to an embodiment of the invention.

DETAILED DESCRIPTION

Figure 1:
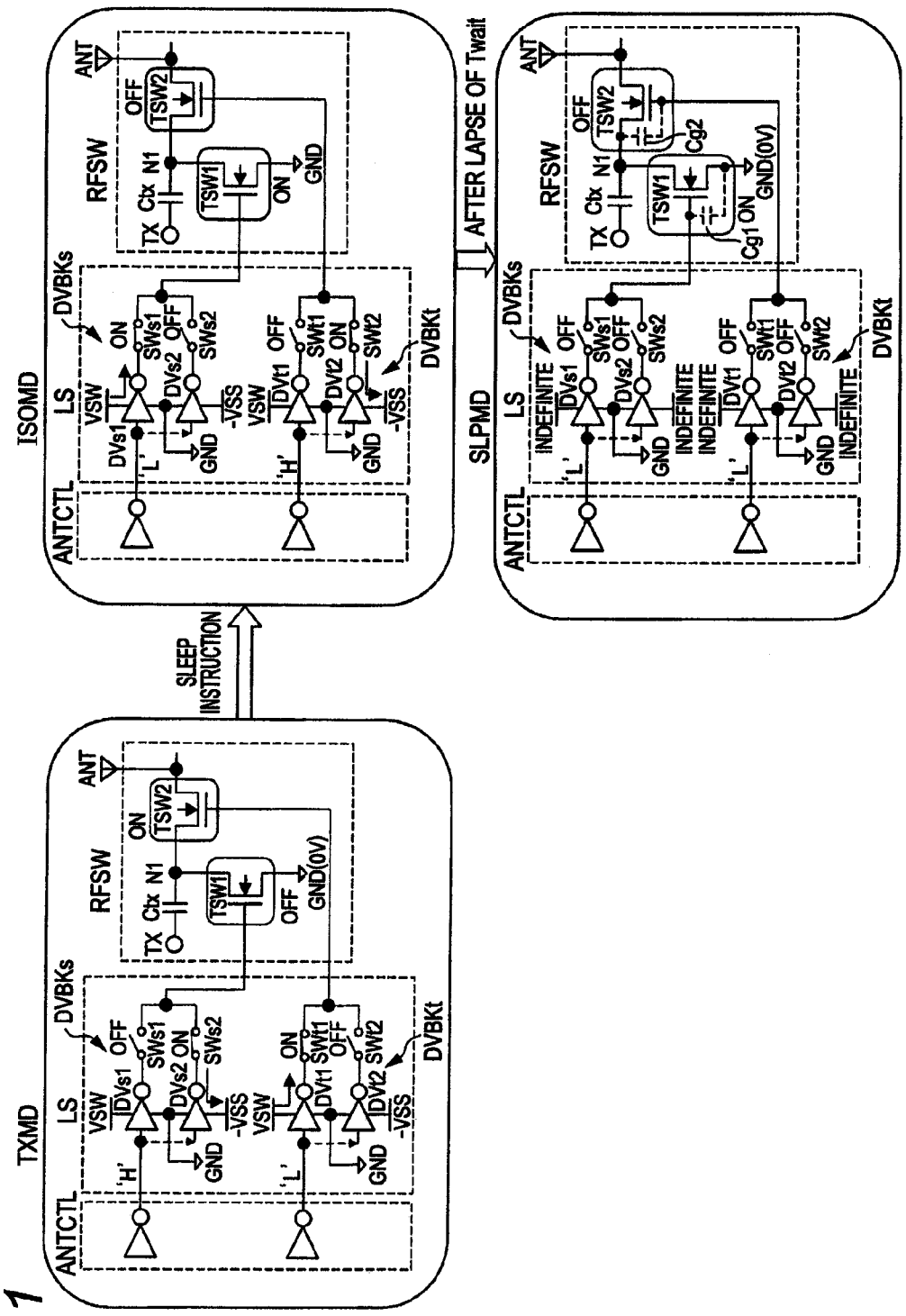
FIG. 1 is a circuit diagram showing a schematic configuration example and an operation example of the main part of a radio frequency module according to an embodiment of the present invention.

In the following embodiments, description will be made by dividing an embodiment into a plurality of sections or embodiments when necessary for the sake of convenience; however, except when a specific indication is given, they are not mutually unrelated, but there is a relationship that one section or embodiment is a modification, specification, or supplementary explanation of part or all of another section or embodiment. Further, in the case where the following embodiments deal with a numerical expression (including a number, a numerical value, amount, range) concerning elements, the numerical expression is not limited to the specific number but may be larger or smaller than the specific number except when a specific indication is given or when the expression is apparently limited to the specific number in principle.

Furthermore, in the following embodiments, the components (including element steps) are not always indispensable except when a specific indication is given or when they are apparently considered to be indispensable in principle. Similarly, in the case where the following embodiments deal with the shape, positional relationship, etc., of the components etc., those substantially approximate or similar to them in shape etc. are also included except when a specific indication is given or when they are apparently considered to be excluded in principle. This also applies to numerical values and ranges described above.

Further, although in the embodiments a MOSFET (Metal Oxide Semiconductor Field Effect Transistor) (abbreviated as a MOS transistor) is used as an example of a MISFET (Metal Insulator Semiconductor Field Effect Transistor), this does not exclude a non-oxide film as a gate insulating film. Hereinafter, preferred embodiments of the present invention will be described in detail with reference to the accompanying drawings. In all the drawings for illustrating the embodiments, the same components or members are basically denoted by the same reference numerals, and their description will not be repeated.

<<Outline of Main Part of Radio Frequency Module (Basic Concept of this Embodiment)>>

Figure 2:
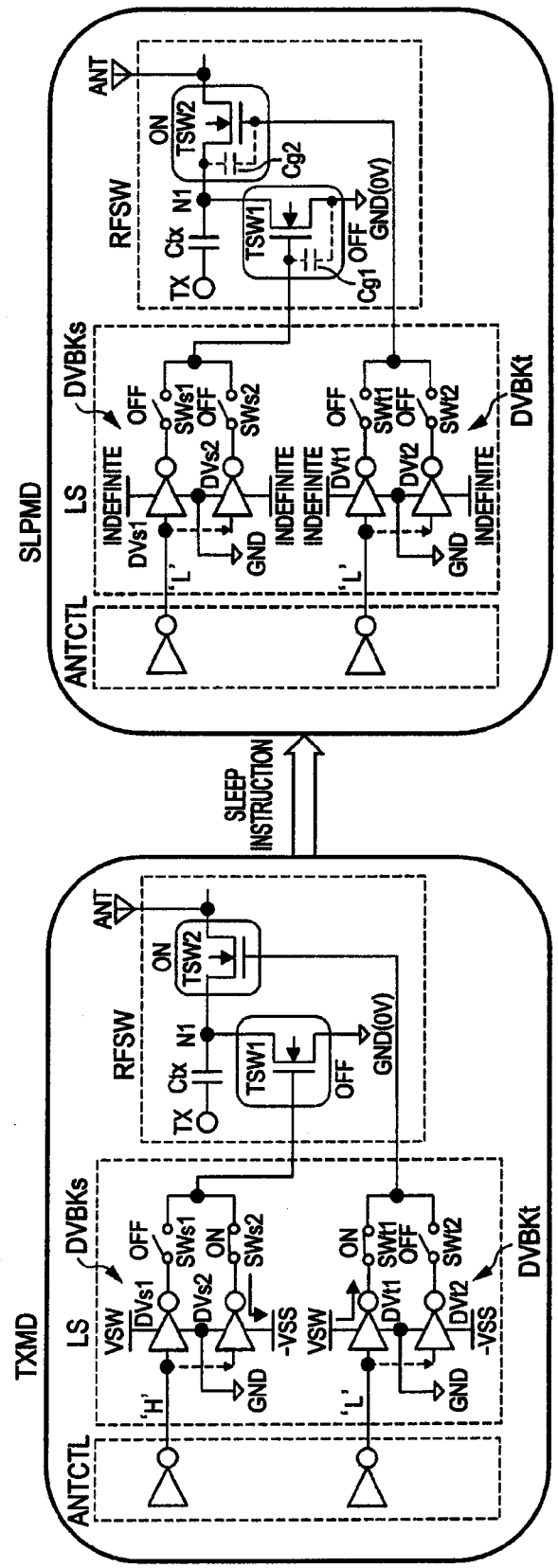
FIG. 2 is a diagram showing a schematic configuration example and an operation example as compared to FIG. 1.

FIG. 1 is a circuit diagram showing a schematic configuration example and an operation example of the main part of a radio frequency module according to an embodiment of the invention. FIG. 2 is a diagram showing a schematic configuration example and an operation example as compared to FIG. 1. In FIG. 2, there are shown the general circuit configuration of the main part comprised of an antenna control circuit ANTCTL, a level shift circuit LS, and a radio frequency (RF) switch circuit RFSW included in the radio frequency module and a circuit state in which the radio frequency module is switched from a transmission operation mode TXMD to a power saving operation mode (sleep mode) SLPMD. The circuits ANTCTL, LS, and RFSW shown in FIG. 2 are formed over, for example, the same SOI substrate.

Figure 20A:
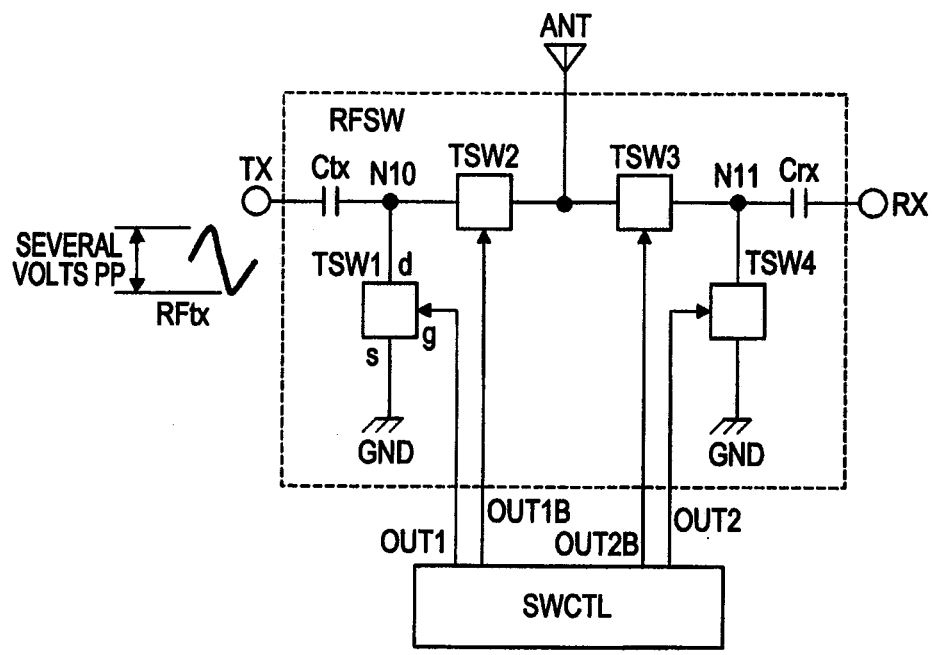
FIG. 20A is a circuit diagram showing the configuration of a radio frequency switch circuit and peripherals in a radio frequency module examined as a premise of the invention.

The radio frequency switch circuit RFSW includes switch transistors TSW1 and TSW2 and a coupling capacitor Ctx for transmission, as in FIG. 20. The transistors TSW1 and TSW2 are n-type MOS transistors, and the capacitor Ctx is e.g. a MIM (Metal Insulator Metal) capacitor. The capacitor Ctx is coupled between a transmission node TX and a node N1. The transistor TSW1 functions as a shunt transistor and has a source-drain path between the node N1 and a ground voltage GND. The transistor TSW2 functions as a through transistor and has a source-drain path between the node N1 and an antenna ANT.

The level shift circuit LS includes a driver circuit block DVBKs for driving the gate of the transistor TSW1 and a driver circuit block DVBKt for driving the gate of the transistor TSW2. The block DVBKs includes switch circuits SWs1 and SWs2 and driver circuits DVs1 and DVs2. One end of the switch circuit SWs1 and one end of the switch circuit SWs2 are coupled in common to the gate of the transistor TSW1. The other end of the switch circuit SWs1 is coupled to an output node of the circuit DVs1, and the other end of the switch circuit SWs2 is coupled to an output node of the circuit DVs2.

The circuit DVs1 operates at a power supply voltage VSW and the ground voltage GND, and outputs a VSW level or a GND level (0 V) in accordance with an input signal (e.g., a signal between the VSW and GND levels) from the circuit ANTCTL.

The circuit DVs2 operates at the ground voltage GND and a negative power supply voltage (−VSS), and outputs the GND level (0 V) or a −VSS level in accordance with an input signal from the circuit ANTCTL. The VSW value is e.g. 3.1 V, and the −VSS value is e.g. −2.6 V.

As in the block DVBKs, the block DVBKt includes switch circuits SWt1 and SWt2 and driver circuits DVt1 and DVt2. One end ("first end" or "output end") of the switch circuit SWt1 and one end of the switch circuit SWt2 are coupled in common to the gate of the transistor TSW2. The other end ("second end" or "input end") of the switch circuit SWt1 is coupled to an output node of the circuit DVt1, and the other end of the switch circuit SWt2 is coupled to an output node of the circuit DVt2.

The circuit DVt1 operates at the voltages VSW and GND, and outputs the VSW level or the GND level in accordance with an input signal from the circuit ANTCTL.

The circuit DVt2 operates at the voltages GND and −VSS, and outputs the GND level or the −VSS level in accordance with an input signal from the circuit ANTCTL.

Thus, each of the blocks DVBKs and DVBKt is a circuit for converting an input signal between the VSW and GND levels into a signal between the VSW and −VSS levels. The driver circuits DVs1, DVs2, DVt1, and DVt2 and the switch circuits SWs1, SWs2, SWt1, and SWt2 are configured with MOS transistors etc. over the SOI substrate in reality. In terms of device breakdown voltage, the use of MOS transistors may make difficult the level conversion by one driver circuit that operates e.g. between the VSW and −VSS levels.

In this case, it is desirable to provide two driver circuits (e.g., DVs1 and DVs2), each of which operates at half the potential difference between the VSW and −VSS levels, and appropriately synthesize the respective outputs through switch circuits (e.g., SWs1 and SWs2). At this time, the circuits SWs1 and SWs2 operate complementarily, and the circuits SWt1 and SWt2 operate complementarily. For example, to turn on the transistor TSW1, the circuit SWs1 is turned on and the circuit SWs2 is turned off so that the VSW level from the circuit DVs1 is conveyed. On the other hand, to turn off the transistor TSW1, the circuit SWs1 is turned off and the circuit SWs2 is turned on so that the −VSS level from the circuit DVs2 is conveyed.

As shown in FIG. 2, in the transmission operation mode TXMD, the circuit SWs1 is turned off and the circuit SWs2 is turned on, so that the −VSS level is applied to the gate of the transistor TSW1, which enters a deep off state. On the other hand, the circuit SWt1 is turned on and the circuit SWt2 is turned off, so that the VSW level is applied to the gate of the transistor TSW2, which enters an on state. Here, assume that the module receives an instruction for transition to the sleep mode SLPMD immediately after the mode TXMD. In brief, the mode SLPMD refers to a mode for implementing power saving by stopping the power supply. With this, the power supply voltage VSW and the negative power supply voltage (−VSS) become indefinite. Although the potential difference between the VSW and GND levels or the potential difference between the GND and −VSS levels enables the circuits SWs1, SWs2, SWt1, and SWt2 to be turned on; when the voltages VSW and −VSS become indefinite (in general, approach the GND level), the potential differences decrease and the switch circuits are turned off. Accordingly, the gates of the transistors TSW1 and TSW2 become high impedance, and the off level (−VSS level) of the transistor TSW1 and the on level (VSW level) of the transistor TSW2 in the mode TXMD are retained by the gate capacitances Cg1 and Cg2 of the transistors TSW1 and TSW2, respectively. This may prevent sufficient securement of isolation characteristics in the mode SLPMD.

For this reason, the radio frequency module according to this embodiment, at the time of receiving an instruction for transition to the mode SLPMD immediately after the mode TXMD, first transitions to an isolation operation mode ISOMD, and then transitions to the sleep mode SLPMD (i.e., a mode in which the power supply is stopped) after a lapse of a certain waiting time (Twait), as shown in FIG. 1.

In FIG. 1, the switch configuration of the radio frequency module in the modes TXMD and SLPMD are the same as in FIG. 2. In the mode ISOMD, the circuit SWs1 is turned on and the circuit SWs2 is turned off, so that the VSW level is applied to the gate of the transistor TSW1, which enters an on state. On the other hand, the circuit SWt1 is turned off and the circuit SWt2 is turned on, so that the −VSS level is applied to the gate of the transistor TSW2, which enters a deep off state. When the module transitions to the mode SLPMD after a lapse of the time Twait in this state, the on level (VSW level) of the transistor TSW1 and the off level (−VSS level) of the transistor TSW2 in the mode ISOMD are retained by the capacitances Cg1 and Cg2 of the transistors TSW1 and TSW2, unlike in FIG. 2.

This enables sufficient securement of isolation characteristics in the sleep mode SLPMD. That is, even if a weak radio signal is sent to the transmission node TX for any reason, the weak radio signal can be reflected or absorbed at the node N1 coupled to the ground GND with low impedance. In addition to this, the transistor TSW2 can be maintained in the off state. As a result, most of the weak radio signal does not reach the antenna ANT, which can prevent undesired radio waves (waves interfering with other communication devices) from being emitted from the antenna ANT during the sleep mode. Although, in the mode SLPMD, the switch circuits SWs1, SWs2, SWt1, and SWt2 are in the off state; in reality, the on and off states immediately before transition to the mode SLPMD may continue for some time. For example, when the −VSS or VSW level continues for some time by a power supply capacitance or the like, the potential difference (between VSW and GND or between GND and −VSS) for turning on the switch circuits also continues. However, in this case as well, the mode TXMD continues in the case of FIG. 2, and the mode ISOMD continues in the case of FIG. 1; therefore, the same advantageous effect as the foregoing one can be obtained.

General Configuration of Radio Frequency Module

Figure 3:
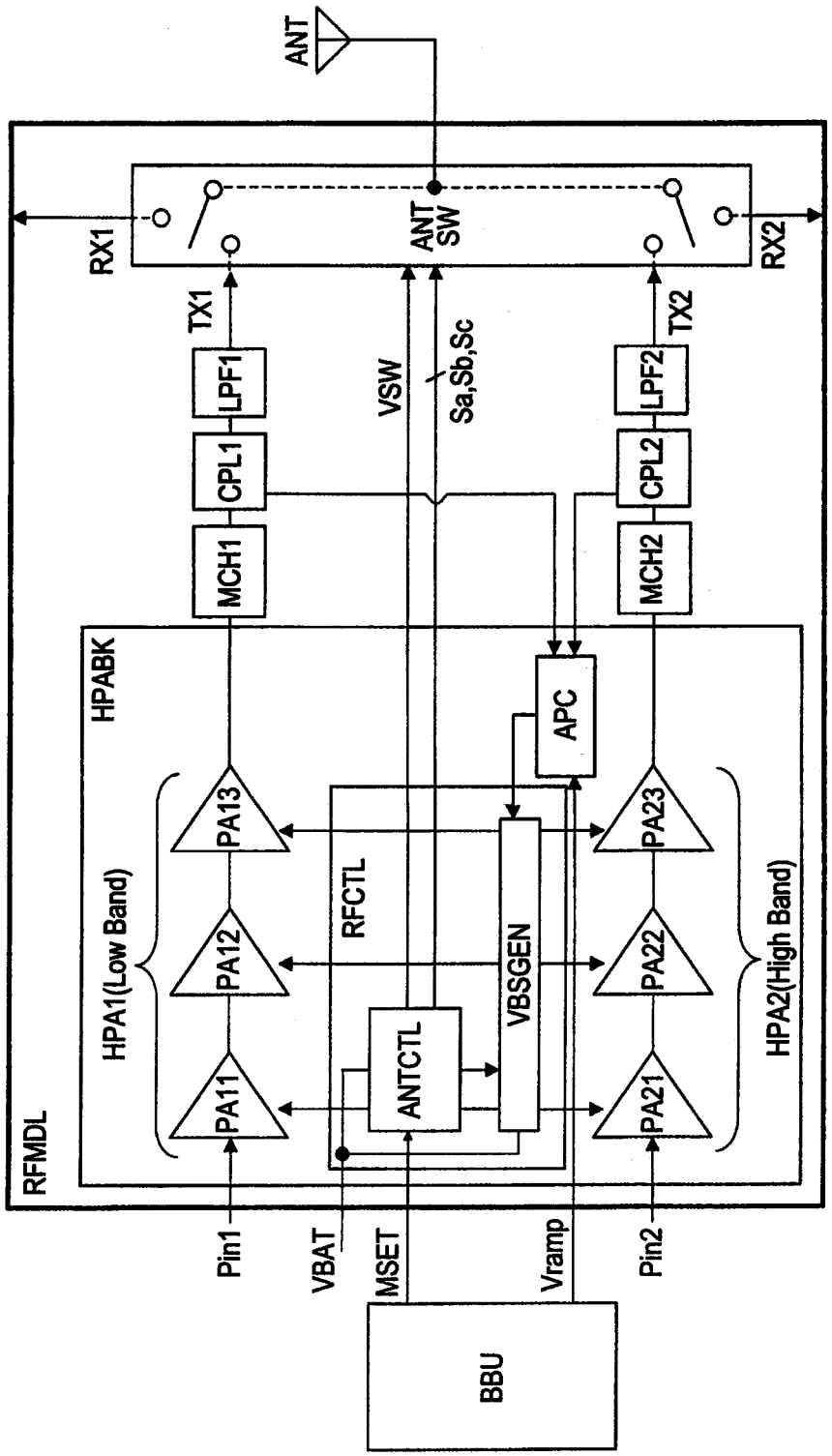
FIG. 3 is a block diagram showing an example of the general configuration of the radio frequency module according to an embodiment of the invention.

FIG. 3 is a block diagram showing an example of the general configuration of the radio frequency module according to an embodiment of the invention. In FIG. 3, the radio frequency module which supports two kinds of bands (referred to as a low band and a high band) is shown as an example. The low band is, for example, a band for the GSM (Global System for Mobile Communications) having transmission frequencies from approximately 824 to 915 MHz and reception frequencies from approximately 869 to 960 MHz. The high band is, for example, a band for the DCS (Digital Cellular System) having transmission frequencies from approximately 1710 to 1910 MHz and reception frequencies from approximately 1805 to 1990 MHz.

The radio frequency module RFMDL shown in FIG. 3 includes a high power amplifier circuit block HPABK, an antenna switch ANTSW, impedance matching circuits MCH1 and MCH2, power detection circuits (couplers) CPL1 and CPL2, and low-pass filters LPF1 and LPF2. The block HPABK includes a high power amplifier circuit HPA1 for the low band, a high power amplifier circuit HPA2 for the high band, an overall control circuit RFCTL, and an automatic power control circuit APC. The circuit HPA1 is configured with three power amplifier circuits PA11 to PA13 which are cascade-coupled in sequence, and the circuit HPA2 is configured with three power amplifier circuits PA21 to PA23 which are cascade-coupled in sequence.

The circuit HPA1 amplifies an input signal Pin1 from outside the module RFMDL (e.g., a transmission mixer circuit or the like (not shown)), and an output signal thereof is sent through the circuits MCH1, CPL1, and LPF1 to a transmission node TX1. The circuit MCH1 performs impedance matching so as to send the output signal of the circuit HPA1 with low loss to the node TX1, the circuit CPL1 detects the power level of the output signal of the circuit HPA1, and the filter LPF1 suppresses undesired harmonic components (e.g., second harmonic, third harmonic) which can occur in the output signal of the circuit HPA1. In the same way, the circuit HPA2 amplifies an input signal Pin2 from outside the module RFMDL, and an output signal thereof is sent through the circuits MCH2, CPL2, and LPF2 to a transmission node TX2. The circuit MCH2 performs impedance matching for the output signal of the circuit HPA2, the circuit CPL2 detects the power level of the output signal of the circuit HPA2, and the filter LPF2 suppresses undesired harmonic components in the output signal of the circuit HPA2.

The overall control circuit RFCTL includes an antenna control circuit ANTCTL and a bias generation circuit VBSGEN. The circuit VBSGEN supplies bias voltages (or bias currents) to the circuits HPA1 and HPA2, thereby controlling the gains (power amplification factors) of the circuits HPA1 and HPA2. At this time, the automatic power control circuit APC compares the output power levels of the circuits HPA1 and HPA2 detected by the circuits CPL1 and CPL2 with a power designation signal (Vramp) inputted from a baseband unit BBU outside the module RFMDL, and informs a comparison result to the circuit VBSGEN. Based on the comparison result, the circuit VBSGEN controls the magnitudes of bias voltages (or bias currents) so that the output power levels of the circuits HPA1 and HPA2 become equal to a value designated by the signal Vramp. The circuit ANTCTL, having a battery power VBAT supplied from outside, supplies a power supply voltage VSW and outputs antenna control signals Sa, Sb, Sc to the antenna switch ANTSW in accordance with an operation mode setting signal MSET inputted from the unit BBU.

The antenna switch ANTSW controls internal switches in accordance with a combination of the power supply voltage VSW and the antenna control signals Sa, Sb, Sc from the circuit ANTCTL. For example, the antenna switch ANTSW couples the transmission node TX1 or a reception node RX1 to an antenna ANT during low-band communication, and couples the transmission node TX2 or a reception node RX2 to the antenna ANT during high-band communication. In this configuration example, low-band signals or high-band signals are directly coupled to the antenna ANT; however, they may be coupled through a diplexer from the antenna switch ANTSW to the antenna ANT. In this case, the diplexer includes a low-pass filter for passing low-band signals and suppressing high-band signals and a high-pass filter which operates inversely to the low-pass filter.

Figure 4:
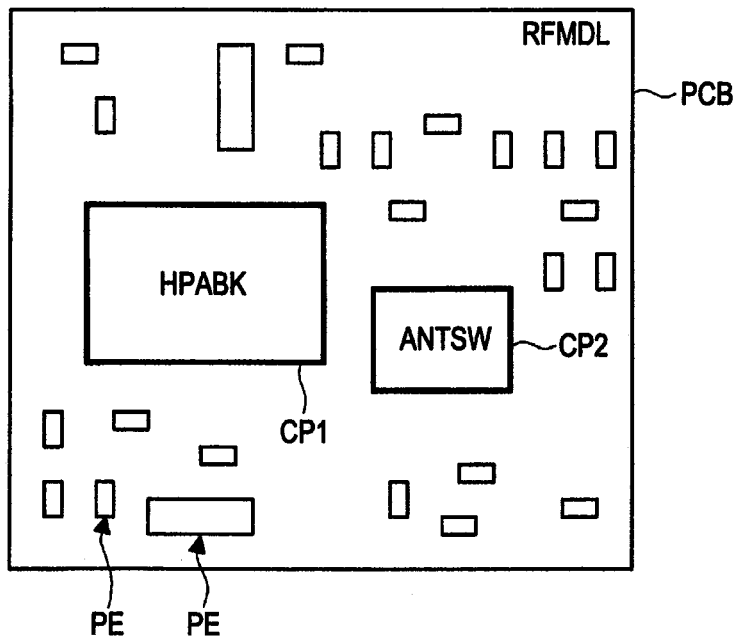
FIG. 4 is a plan view showing a schematic outline example of the radio frequency module shown in FIG. 3.

FIG. 4 is a plan view showing a schematic outline example of the radio frequency module RFMDL shown in FIG. 3. In the configuration of the module RFMDL, two semiconductor chips CP1 and CP2 and various passive components PE (capacitors, inductors, resistors, etc.) are mounted over a wiring board PCB (e.g., a ceramic board, a glass epoxy board, or the like) containing a plurality of wiring layers, and these components are coupled as appropriate via wiring layers. The chip CP1 includes the high power amplifier circuit block HPABK formed by a CMOS manufacturing process over a silicon substrate for example. The circuits HPA1 and HPA2 are configured with power MOS transistors (LDMOSFET) of LD (Laterally Diffused) structure for example. The chip CP2 includes the antenna switch ANTSW formed over an SOI substrate for example. Specifically, the antenna switch ANTSW is configured with MOS transistors, MIM (Metal Insulator Metal) capacitors, etc. The components PE are, for example, SMD (Surface Mount Device) components. The components PE configure the impedance matching circuits MCH1 and MCH2, the couplers CPL1 and CPL2, and the low-pass filters LPF1 and LPF2. Some passive components configuring the impedance matching circuits, the couplers, and the low-pass filters may be formed with wiring layers and insulating layers over the wiring board.

The radio frequency module RFMDL shown in FIGS. 3 and 4 is selectively set to the power saving operation mode (sleep mode) in addition to the transmission operation mode and a reception operation mode, in accordance with the operation mode setting signal MSET from the baseband unit BBU. In the power saving operation mode, the module RFMDL stops, for example, the operation of the automatic power control circuit APC and the bias voltage (or bias current) generation operation of the bias generation circuit VBSGEN. At this time, the antenna control circuit ANTCTL determines the content of the signal MSET and outputs a control signal to the circuits APC and VBSGEN as appropriate, so that the circuits APC and VBSGEN recognizes that they have been set to the power saving operation mode. Further, in the power saving operation mode, the circuit ANTCTL stops the generation and supply of the power supply voltage VSW to the antenna switch ANTSW, and fixes the antenna control signals Sa, Sb, Sc to the GND level (0 V), using the battery power VBAT.

Detailed Example of High Power Amplifier Circuit

Figure 5:
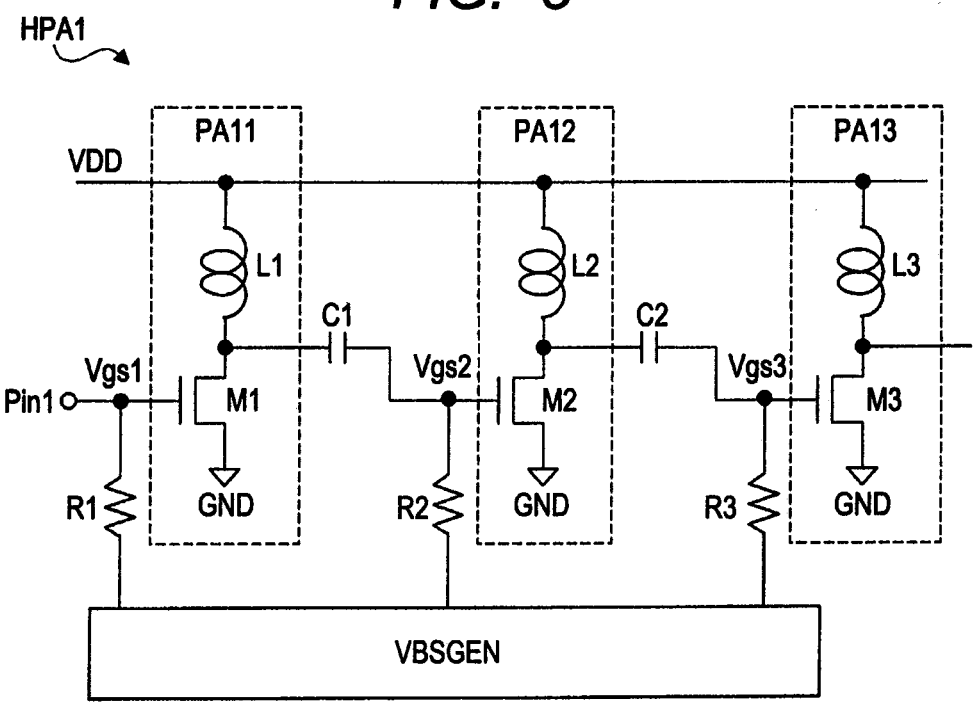
FIG. 5 is a circuit diagram showing a schematic configuration example of a high power amplifier circuit shown in FIG. 3.

FIG. 5 is a circuit diagram showing a schematic configuration example of the high power amplifier circuit HPA (HPA1, HPA2) shown in FIG. 3. In FIG. 5, the circuit HPA1 is taken as an example; however, the same configuration example applies to the circuit HPA2. In FIG. 5, the power amplifier circuit PA11 includes a MOS transistor M1 (n-channel power MOS transistor of LD (Laterally Diffused) structure (n-channel LDMOSFET) in this example) having a source coupled to the ground voltage GND and a load circuit (inductor L1 in this example) provided between the drain of the transistor M1 and a power supply voltage VDD. Similarly, the circuit PA12 includes a grounded-source MOS transistor M2 and an inductor L2, and the circuit PA13 includes a grounded-source MOS transistor M3 and an inductor L3.

The input signal Pin1 is inputted to the gate of the transistor M1, and also a bias voltage Vgs1 is applied from the bias generation circuit VBSGEN through a resistor R1 (high resistance element for AC cut (suppression)) to the gate of the transistor M1. An output signal from the drain of the transistor M1 is inputted through a capacitor C1 for DC cut to the gate of the transistor M2, and also a bias voltage Vgs2 is applied from the bias generation circuit VBSGEN through a resistor R2 to the gate of the transistor M2 in the same way as in the transistor M1. An output signal from the drain of the transistor M2 is inputted through a capacitor C2 for DC cut to the gate of the transistor M3, and also a bias voltage Vgs3 is applied from the bias generation circuit VBSGEN through a resistor R3 to the gate of the transistor M3 in the same way as in the transistor M1. In the sleep mode, for example the voltages Vgs1 to Vgs3 are set to 0 V. Accordingly, the transistors M1 to M3 are fixed to a cutoff state, so that a steady current does not flow into the circuit HPA1.

Thus, in the sleep mode, the bias is not supplied to the circuit HPA1; therefore, the circuit HPA1 ideally does not perform either an amplification operation or an output operation. However, in reality, the circuit HPA1 may perform some output operation for some time due to the parasitic capacitance or the like of the circuit HPA1. That is, the circuit HPA1 is formed with relatively large-sized transistors, leading to large parasitic capacitance, so that high frequency noise etc. may be sent to the output side with low impedance. Further, since the circuit HPA1 includes a lot of capacitance and inductance components as described, for example a parasitic oscillation may occur in transition to the sleep mode. Therefore, it is desirable to sufficiently secure isolation characteristics between the transmission node TX1 and the antenna ANT in the antenna switch ANTSW of the subsequent stage.

The power consumption of the radio frequency module RFMDL can be about 30 dBm(W) during the normal operation (e.g., transmission operation mode), but is reduced to e.g. −50 dBm(W) (negative 50 dBm(W)) during the sleep mode. For example, in battery-powered devices typified by a cellular phone, the use of the sleep mode can prolong the battery duration. While the configuration example of the module RFMDL which supports two kinds of bands (the low band and the high band) is shown in FIG. 3 etc., it is not limited thereto. The module may have a configuration that supports one kind of band or a configuration that supports three or more kinds of bands including bands for W-CDMA (Wideband Code Division Multiple Access) and LTE (Long Term Evolution).

Detailed Example of Antenna Switch

Figure 6:
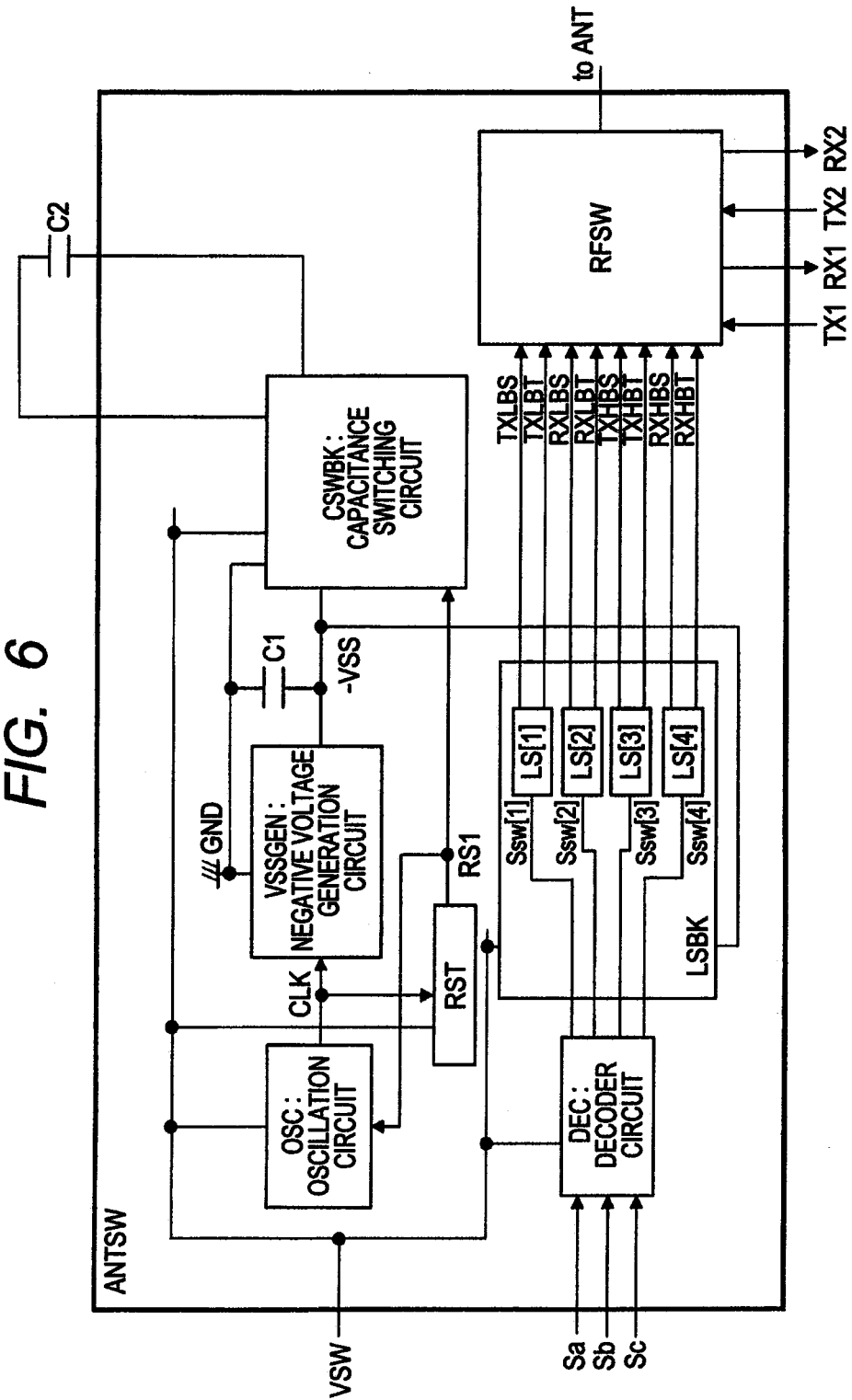
FIG. 6 is a block diagram showing a detailed configuration example of an antenna switch shown in FIG. 3.

FIG. 6 is a block diagram showing a detailed configuration example of the antenna switch ANTSW shown in FIG. 3. The antenna switch ANTSW shown in FIG. 6 includes an oscillation circuit OSC, a negative voltage generation circuit VSSGEN, a capacitance switching circuit CSWBK, a reset circuit RST, a decoder circuit DEC, a level shift circuit block LSBK, a radio frequency switch circuit RFSW, and a capacitor C1. The circuit OSC generates a clock signal CLK, using the power supply voltage VSW from the antenna control circuit ANTCTL in FIG. 3. The circuit VSSGEN generates a negative power supply voltage (−VSS) at the capacitor C1 or the like, using the signal CLK. The circuit RST detects the rise of the power supply voltage VSW, and activates a reset signal RS1 in several cycles of the signal CLK. The circuit CSWBK controls whether or not to couple the capacitor C1 and, e.g., an external capacitor C2 in parallel in accordance with the state of the signal RS1. Further, the circuit OSC also switches oscillation frequencies in accordance with the state of the signal RS1. Further details relating to the signal RS1 will be described later.

The decoder circuit DEC receives the power supply voltage VSW and the antenna control signals Sa, Sb, Sc from the antenna control circuit ANTCTL, generates a plurality of (four in this example) switch control signals Ssw[1] to Ssw[4] corresponding to these states, and outputs the signals to the level shift circuit block LSBK. The block LSBK includes a plurality of (four in this example) level shift circuits LS[1] to LS[4], and each level shift circuit LS[n] (n=1 to 4) converts the respective switch control signal Ssw[n] having the amplitude voltage between VSW and GND inputted from the circuit DEC into a signal having the amplitude voltage between VSW and −VSS and outputs the bipolar signal.

Specifically, in response to the signal Ssw[1] having the amplitude voltage between VSW and GND, the circuit LS[1] outputs a switch on-off signal (shunt signal during low-band transmission) TXLBS having the amplitude voltage between VSW and −VSS and a switch on-off signal (through signal during low-band transmission) TXLBT which is an inversion signal thereof. Similarly, the circuit LS[2] outputs switch on-off signals RXLBS and RXLBT in response to the signal Ssw[2], the circuit LS[3] outputs switch on-off signals TXHBS and TXHBT in response to the signal Ssw[3], and the circuit LS[4] outputs switch on-off signals RXHBS and RXHBT in response to the signal Ssw[4]. The signals RXLBS and RXLBT is a shunt signal and a through signal which is an inversion signal thereof during low-band reception, respectively. The signals TXHBS and TXHBT is a shunt signal and a through signal which is an inversion signal thereof during high-band transmission, respectively. The signals RXHBS and RXHBT is a shunt signal and a through signal which is an inversion signal thereof during high-band reception, respectively. The radio frequency switch circuit RFSW performs on-off control of internal switch transistors in accordance with these switch on-off signals to appropriately control the coupling relation between the transmission nodes TX1, TX2 and the reception nodes RX1, RX2 and the antenna ANT.

Figure 7:
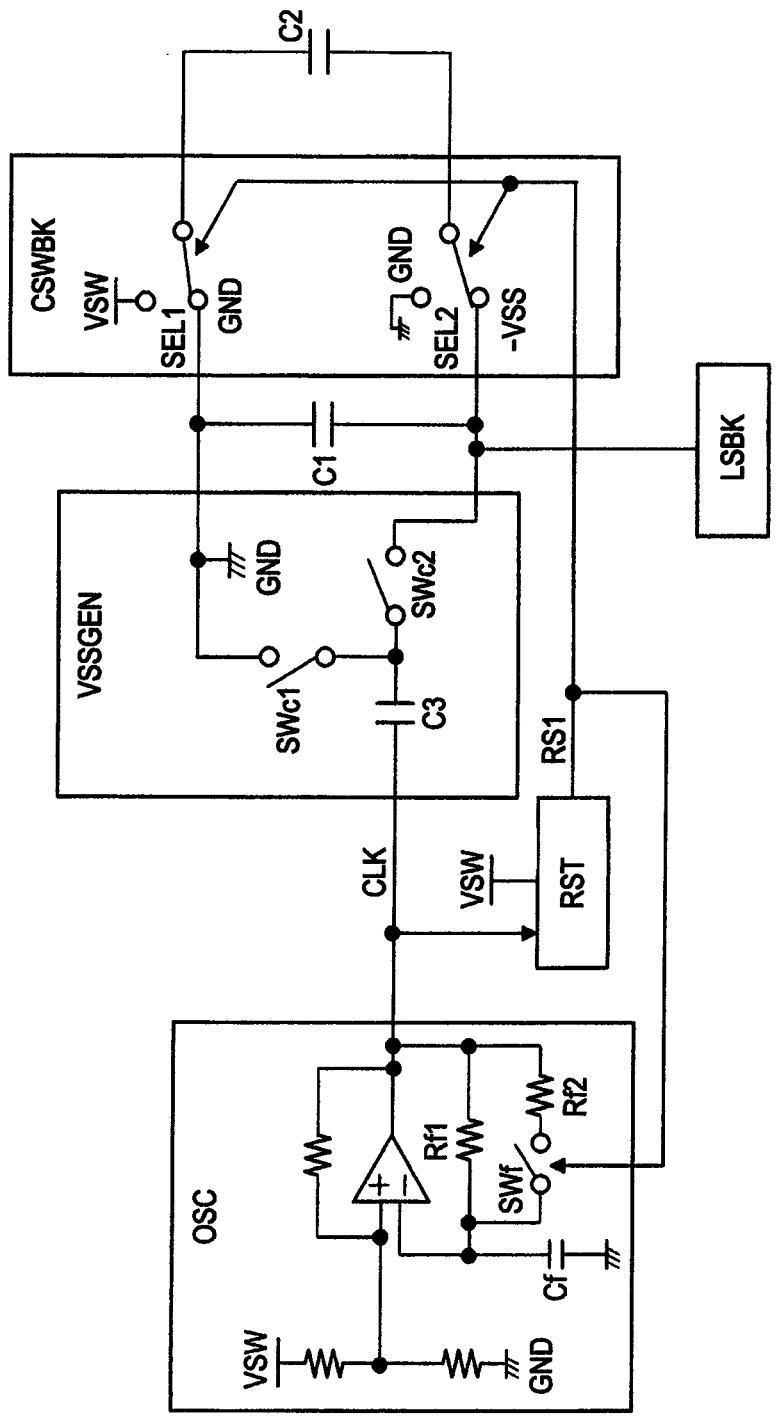
FIG. 7 is a circuit diagram showing a schematic configuration example of an oscillation circuit, a negative voltage generation circuit, and a capacitance switching circuit in the antenna switch shown in FIG. 6.

FIG. 7 is a circuit diagram showing a schematic configuration example of the oscillation circuit OSC, the negative voltage generation circuit VSSGEN, and the capacitance switching circuit CSWBK in the antenna switch ANTSW shown in FIG. 6. In FIG. 7, although not limited in particular, the oscillation circuit OSC is an RC oscillation circuit whose oscillation frequency can be set by the values of resistors Rf1 and Rf2 and a capacitor Cf provided in a feedback path. A switch SWf is coupled in series to the resistor Rf2, and the resistor Rf2 and the switch SWf are coupled in parallel to the resistor Rf1. Therefore, when the switch SWf is off (open), the clock signal CLK of a relatively low frequency is generated based on a time constant Rf1×Cf, and when the switch SWf is on (closed), the clock signal CLK of a relatively high frequency is generated based on a time constant (Rf1·Rf2/(Rf1+Rf2))×Cf.

Although not limited in particular, the negative voltage generation circuit VSSGEN is a charge pump circuit including a capacitor C3 to one end of which the signal CLK is inputted, a switch SWc1 coupled between the other end of the capacitor C3 and the ground GND, and a switch SWc2 coupled between the other end of the capacitor C3 and one end of the capacitor C1. The other end of the capacitor C1 is coupled to the ground GND.

When the signal CLK is at an 'H' level (VSW level), the switch SWc1 is turned on and the switch SWc2 is turned off, so that positive charge and negative charge corresponding to the VSW level are stored on the OSC side and SWc2 side of the capacitor C3, respectively.

On the other hand, when the signal CLK is at an 'L' level (GND level), the switch SWc1 is turned off and the switch SWc2 is turned on, so that the negative charge stored on the SWc2 side of the capacitor C3 is transferred to the capacitor C1. The capacitors C1 and C3 are, e.g., MIM capacitors, and C1>C3 in general. By repeating the 'H' level period and the 'L' level period, it is ideally possible to generate the negative power supply voltage (−VSS) of a −VSW level on the SWc2 side of the capacitor C1.

The capacitance switching circuit CSWBK includes a selector circuit SEL1 for selecting whether to couple one end of the capacitor C2 to the power supply voltage VSW or the ground voltage GND and a selector circuit SEL2 for selecting whether to couple the other end of the capacitor C2 to the ground GND or the node on the SWc2 side of the capacitor C1. The capacitor C2 has a larger capacitance value than the capacitor C1 and is mounted as an SMD external component or the like. The reset circuit RST detects the rise of the power supply voltage VSW, and activates the reset signal RS1 in several cycles of the signal CLK. Nodes to be selected by the circuits SEL1 and SEL2 in the circuit CSWBK are determined in accordance with the state of the signal RS1, and on-off control of the switch SWf in the circuit OSC is performed in accordance with the state of the signal RS1.

Figure 8:
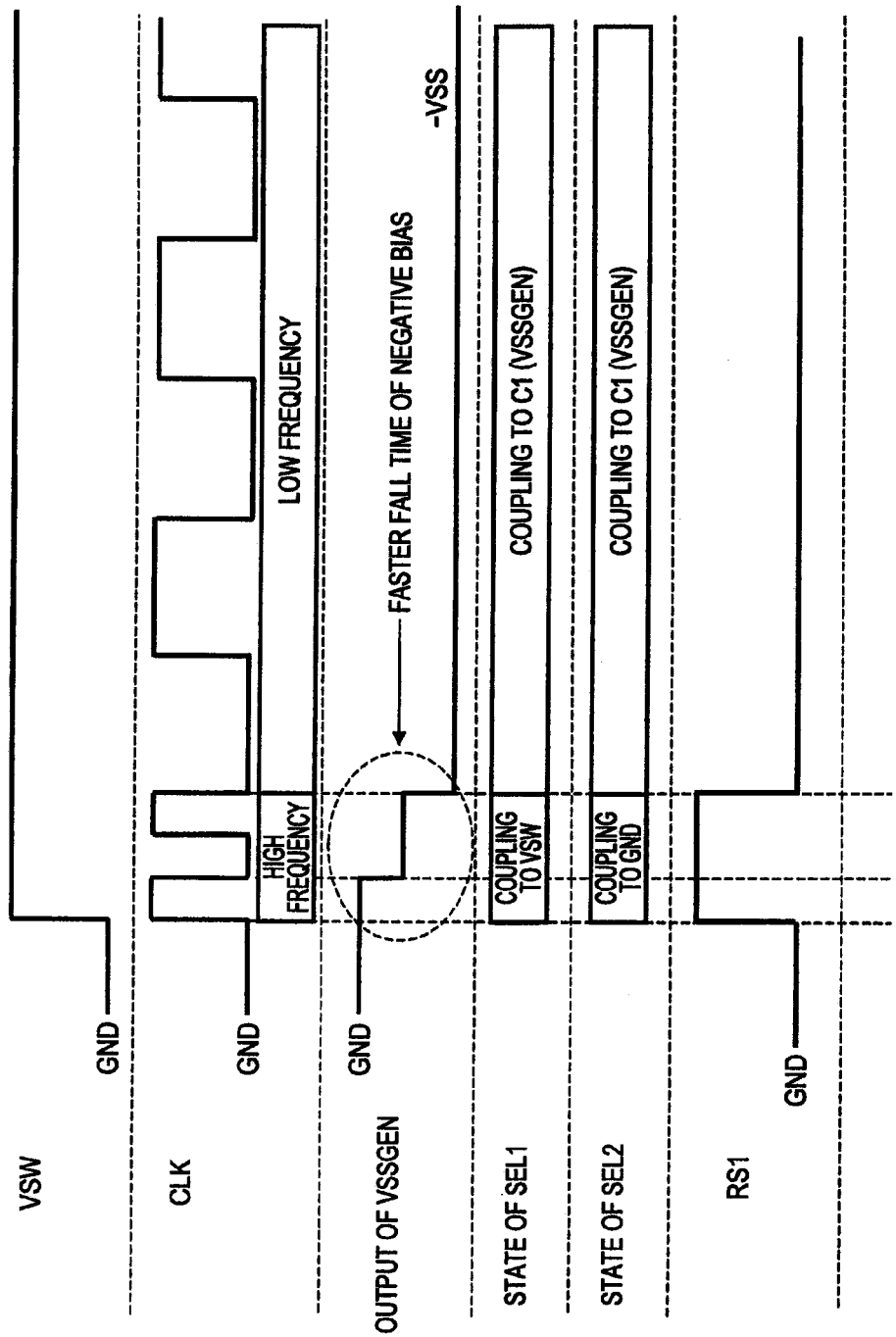
FIG. 8 is a waveform chart showing a schematic operation example of the circuits in FIG. 7.

FIG. 8 is a waveform chart showing a schematic operation example of the circuits in FIG. 7. As shown in FIG. 8, when the power supply voltage VSW rises, the reset circuit (power-on reset circuit) RST outputs the reset signal RS1 of an 'H' pulse in a plurality of cycles (two cycles in this example) of the clock signal CLK. During the 'H' pulse period of the signal RS1, the oscillation circuit OSC generates the signal CLK of the relatively high frequency with the switch SWf on, and the capacitance switching circuit CSWBK couples one end of the capacitor C2 to the power supply voltage VSW and couples the other end to the ground GND, using the selector circuits SEL1 and SEL2. Therefore, in this period, the negative voltage generation circuit VSSGEN generates a negative voltage in the capacitor C1 having a relatively small capacitance using the signal CLK of the relatively high frequency, thus making it possible to reduce the fall time period of the negative voltage.

On the other hand, when the signal RS1 transitions from the 'H' level to the 'L' level, the circuit OSC generates the signal CLK of the relatively low frequency with the switch SWf off, and the circuit CSWBK parallelly couples both ends of the capacitor C2 to both ends of the capacitor C1, through the circuits SEL1 and SEL2. During the 'H' pulse period of the signal RS1, since the capacitance value of the capacitor C1 is small and the signal CLK of the relatively high frequency is used, a large ripple may occur in the negative power supply voltage (−VSS) generated by the circuit VSSGEN. Therefore, in the period after the signal RS1 transitions to the 'L' level, the capacitance value is increased by adding C2 to C1 and the signal CLK of the relatively low frequency is used, thereby making it possible to reduce the ripple. Further, the electric charge of the VSW level is charged at both ends of the capacitor C2 beforehand during the 'H' pulse period of the signal RS1 so as to match the voltage polarity of the capacitor C1 at the time of parallelly coupling the capacitors C1 and C2, which also can reduce voltage fluctuation accompanying the parallel coupling. Thus, the use of the configuration example shown in FIG. 7 and the operation example shown in FIG. 8 enables the negative power supply voltage (−VSS) to be generated and stabilized rapidly in accordance with the rise of the power supply voltage VSW due to return from the sleep mode to the normal operation mode, which can reduce the time required for return from the sleep mode.

Detailed Example of Radio Frequency Switch Circuit

Figure 9:
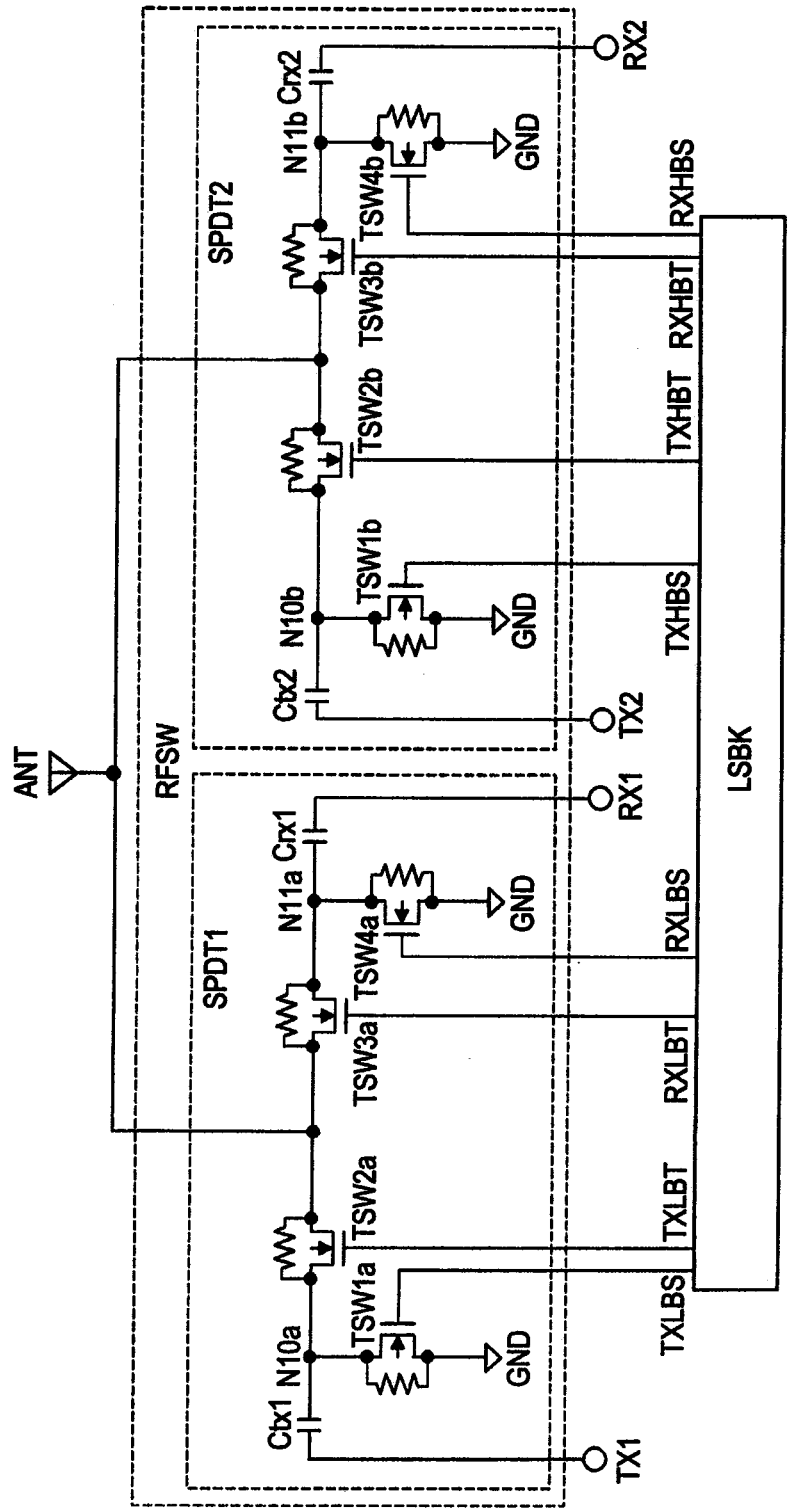
FIG. 9 is a block diagram showing a detailed configuration example of a radio frequency switch circuit in the antenna switch shown in FIG. 6.

FIG. 9 is a block diagram showing a detailed configuration example of the radio frequency switch circuit RFSW in the antenna switch ANTSW shown in FIG. 6. The radio frequency switch circuit RFSW shown in FIG. 6 includes two switch units (SPDT1 and SPDT2) called SPDT (Single Pole Double Throw). The switch unit SPDT1 is provided corresponding to the low-band side (transmission node TX1, reception node RX1) in FIG. 6, and the switch unit SPDT2 is provided corresponding to the high-band side (transmission node TX2, reception node RX2) in FIG. 6.

The switch unit SPDT1 includes, for example, four switch transistors TSW1a to TSW4a and two coupling capacitors Ctx1 and Crx1. In FIG. 9, the transistors TSW1a to TSW4a are n-channel type MOS transistors. Since the switch transistors are required to operate at high speed, it is desirable to use the n-channel type rather than the p-channel type. The transistor TSW2a is a through transistor during low-band transmission. In the transistor TSW2a, one end of the source/drain is coupled to the antenna ANT, the other end is coupled to a node N10a, and the gate is driven by the switch on-off signal (through signal during low-band transmission) TXLBT shown in FIG. 6. The transistor TSW1a is a shunt transistor during low-band transmission. In the transistor TSW1a, one end of the source/drain is coupled to the node N10a, the other end is coupled to the ground voltage GND, and the gate is driven by the switch on-off signal (shunt signal during low-band transmission) TXLBS shown in FIG. 6. The capacitor Ctx1 is provided between the transmission node TX1 and the node N10a.

The transistor TSW3a is a through transistor during low-band reception. In the transistor TSW3a, one end of the source/drain is coupled to the antenna ANT, the other end is coupled to a node N11a, and the gate is driven by the switch on-off signal (through signal during low-band reception) RXLBT shown in FIG. 6. The transistor TSW4a is a shunt transistor during low-band reception. In the transistor TSW4a, one end of the source/drain is coupled to the node N11a, the other end is coupled to the ground voltage GND, and the gate is driven by the switch on-off signal (shunt signal during low-band reception) RXLBS shown in FIG. 6. The capacitor Crx1 is provided between the reception node RX1 and the node N11a. Further, in each of the transistors TSW1a to TSW4a, a high resistance element is coupled between the source and the drain. Accordingly, for example, in the transistors TSW2a and TSW3a, the sources (and drains) are biased to the GND level through the high resistance elements of the transistors TSW1a and TSW4a and the high resistance elements of the transistors TSW2a and TSW3a respectively, and on-off control is performed by gate voltage values with respect to the GND level.

Although each of the transistors TSW1a to TSW4a is shown as one transistor in FIG. 9, in reality each transistor may be configured with multiple transistors having sources and drains coupled in series and gates coupled in common. The configuration of multiple transistors facilitates securement of source-drain breakdown voltage in comparison with one transistor. Further, the coupling of source-drain off-capacitances in series in the off state can reduce the off-capacitance in comparison with one transistor, which can reduce signal leakage caused by source-drain coupling. However, the use of series coupling may increase the source-drain on resistance (i.e., insertion loss) in the on state; thus, there is a tradeoff therebetween.

On the other hand, the switch unit SPDT2 as well as the switch unit SPDT1 includes, for example, four switch transistors TSW1b to TSW4b and two coupling capacitors Ctx2 and Crx2. In FIG. 9, the transistors TSW1b to TSW4b are n-channel MOS transistors. The transistor TSW2b is a through transistor during high-band transmission. In the transistor TSW2b, one end of the source/drain is coupled to the antenna ANT, the other end is coupled to a node N10b, and the gate is driven by the switch on-off signal (through signal during high-band transmission) TXHBT shown in FIG. 6. The transistor TSW1b is a shunt transistor during high-band transmission. In the transistor TSW1b, one end of the source/drain is coupled to the node N10b, the other end is coupled to the ground GND, and the gate is driven by the switch on-off signal (shunt signal during high-band transmission) TXHBS shown in FIG. 6. The capacitor Ctx2 is provided between the transmission node TX2 and the node N10b.

The transistor TSW3b is a through transistor during high-band reception. In the transistor TSW3b, one end of the source/drain is coupled to the antenna ANT, the other end is coupled to a node N11b, and the gate is driven by the switch on-off signal (through signal during high-band reception) RXHBT shown in FIG. 6. The transistor TSW4b is a shunt transistor during high-band reception. In the transistor TSW4b, one end of the source/drain is coupled to the node N11b, the other end is coupled to the ground GND, and the gate is driven by the switch on-off signal (shunt signal during high-band reception) RXHBS shown in FIG. 6. The capacitor Crx2 is provided between the reception node RX2 and the node N11b. Further, in each of the transistors TSW1b to TSW4b, a high resistance element is coupled between the source and the drain. Furthermore, each of the transistors TSW1b to TSW4b as well as the transistors TSW1a to TSW4a may be configured with multiple transistors.

Figure 10:
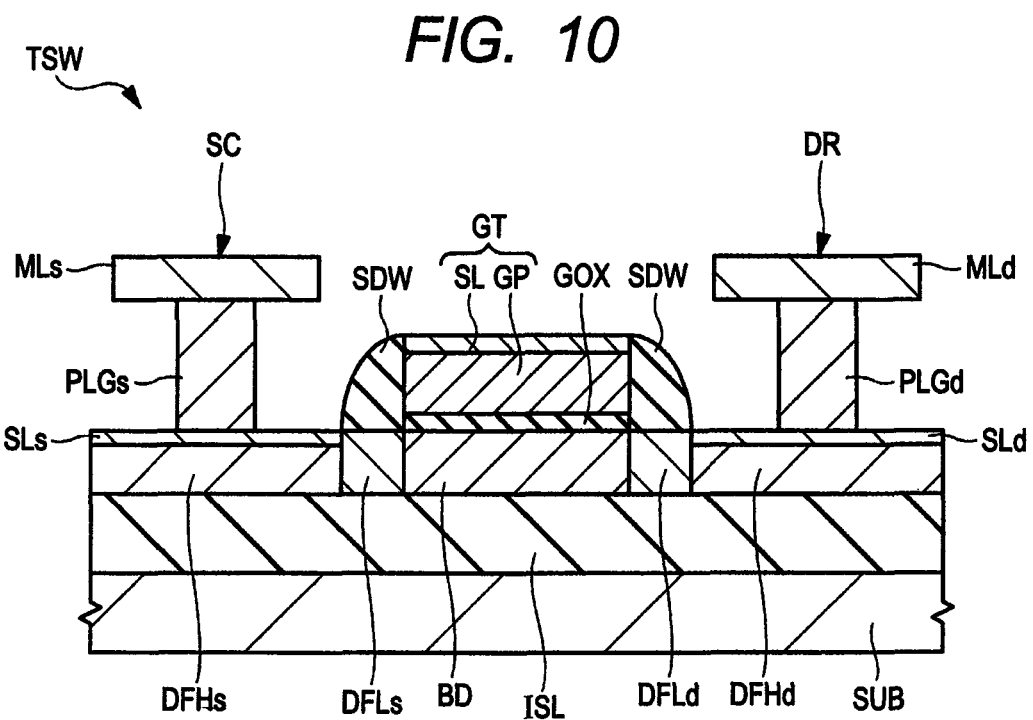
FIG. 10 is a sectional view showing a device configuration example of each switch transistor in the radio frequency switch circuit shown in FIG. 9.

FIG. 10 is a sectional view showing a device configuration example of each switch transistor in the radio frequency switch circuit RFSW shown in FIG. 9. A switch transistor TSW (TSW1a to TSW4a, TSW1b to TSW4b) shown in FIG. 10 is an n-channel MOS transistor formed over an SOI substrate. In FIG. 10, an insulating film ISL is formed over a semiconductor substrate SUB such as silicon, a body region BD is formed thereover, and diffusion layers DFLs and DFLd are formed on both sides thereof. Further, a diffusion layer DFHs is formed adjacent to the diffusion layer DFLs, and a diffusion layer DFHd is formed adjacent to the diffusion layer DFLd. The layers DFLs and DFHs are part of a source SC, and the layers DFLd and DFHd are part of a drain DR. The region BD is, for example, a semiconductor region having p-type impurities, and the layers DFLs, DFHs, DFLd, and DFHd are, for example, semiconductor regions having n-type impurities. The layers DFLs and DFLd have lower impurity density than the layers DFHs and DFHd, which enhances the device breakdown voltage etc.

A gate electrode GT is formed over the body region BD through a gate insulating film GOX such as oxide silicon. The electrode GT includes, for example, a polysilicon layer GP formed over the film GOX and a silicide layer (e.g., cobalt silicide) SL, formed thereover, for lower resistance of the electrode GT. Side walls SDW which are insulating films are formed in regions located on both sides of the electrode GT and located over the layers DFLs and DFLd. Further, silicide layers (e.g., cobalt silicide) SLs and Sld are formed over the layers DFHs and DFHd, respectively. A wiring layer MLs is formed through a plug PLGs over the layer SLs, and a wiring layer MLd is formed through a plug PLGd over the layer SLd. The layer SLs, the plug PLGs, and the layer MLs are part of the source SC, and the layer SLd, the plug PLGd, and the layer MLd are part of the drain DR. The plugs PLGs and PLGd are titanium/titanium nitride and tungsten, and the layers MLs and MLd are the laminated film of titanium/titanium nitride and aluminum or the like.

Figure 11:
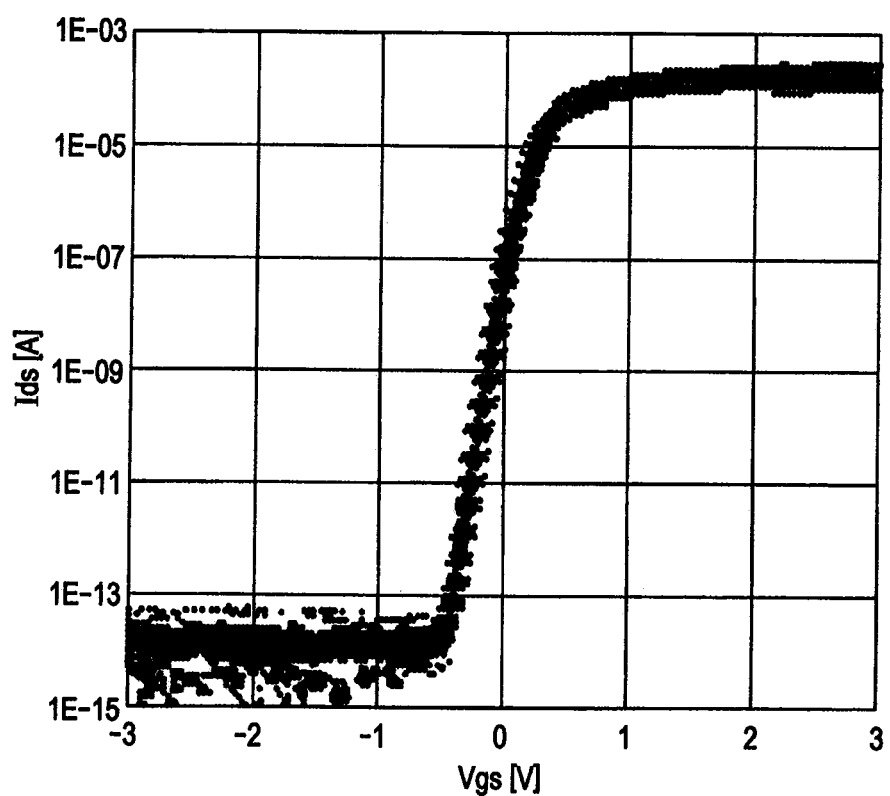
FIG. 11 is a graph showing one example of electrical characteristics of the switch transistor shown in FIG. 10.
Figure 20B:
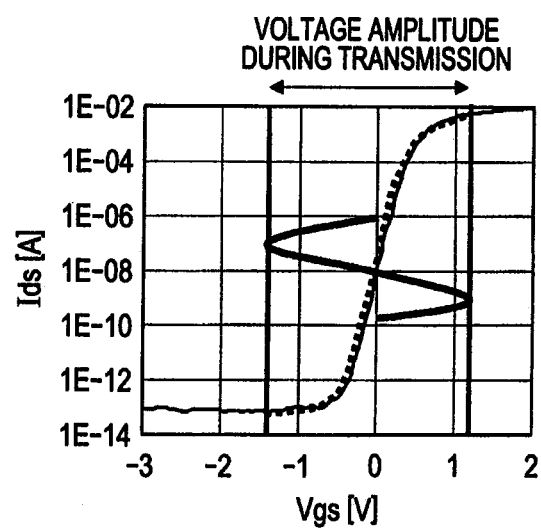
FIG. 20B is an explanatory diagram showing an operation example during transmission in FIG. 20A.
Figure 21:
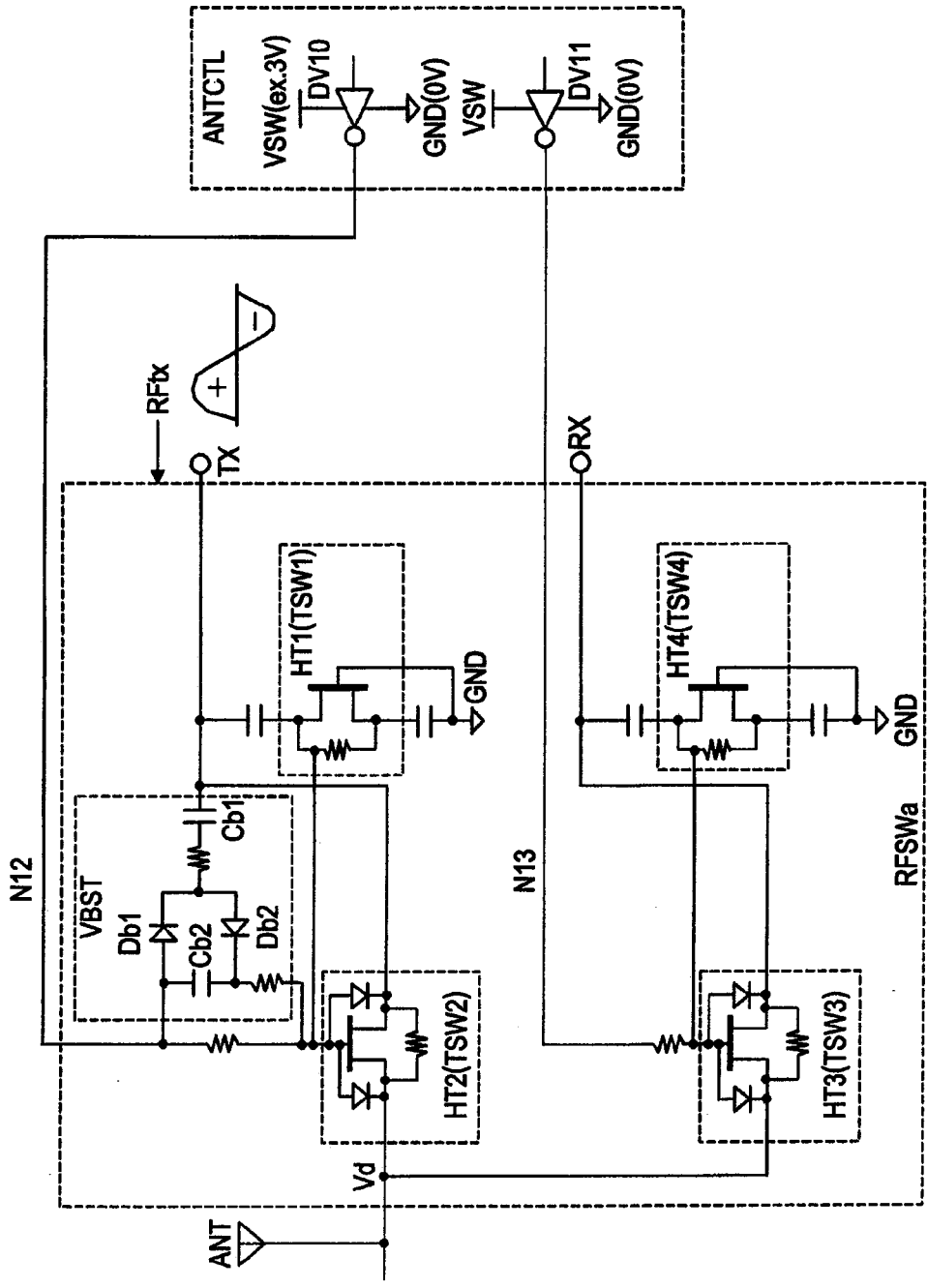
FIG. 21 is a circuit diagram showing a detailed configuration example of the circuit in FIG. 20A by way of example of the method of using a booster circuit.
Figure 22:
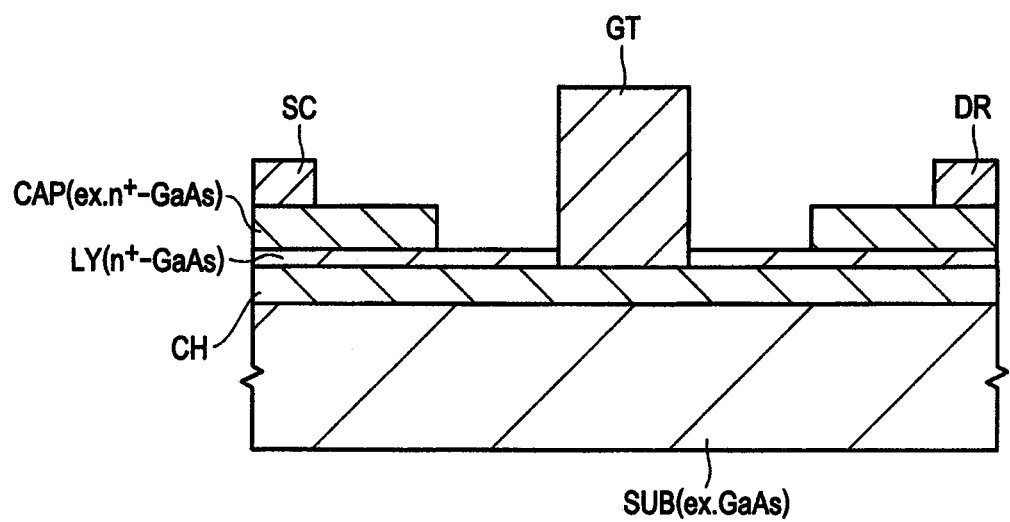
FIG. 22 is a sectional view showing a device structure example of each switch transistor in FIG. 21.

FIG. 11 is a graph showing one example of electrical characteristics of the switch transistor shown in FIG. 10. In FIG. 11, the relation between a gate-source voltage Vgs and a drain-source current Ids is shown. In FIG. 11, although not limited in particular, the n-channel MOS transistor of depression characteristics is used as the switch transistor TSW. Its threshold voltage Vth is, e.g., about −0.5 V. For example, in the case where an amplitude of the transmission radio frequency signal RFtx of about ±1.2 V across 0 V is generated as shown in FIG. 20B; to maintain the transistor TSW in the off state at −1.2 V, it is necessary to apply a negative voltage of about −2.0 V (Vgs=−0.8 V in this case) or less to the gate. In this embodiment, the negative voltage during the off state (negative power supply voltage −VSS generated by the circuit VSSGEN in FIG. 6) is set to −2.6 V or the like, in terms of a tradeoff between margin securement associated with variation in the threshold voltage Vth (a lower negative voltage is desirable) and margin securement associated with the device breakdown voltage (a higher negative voltage is desirable).

Detailed Example of Antenna Control Circuit (Characteristic Configuration of this Embodiment)

Figure 12:
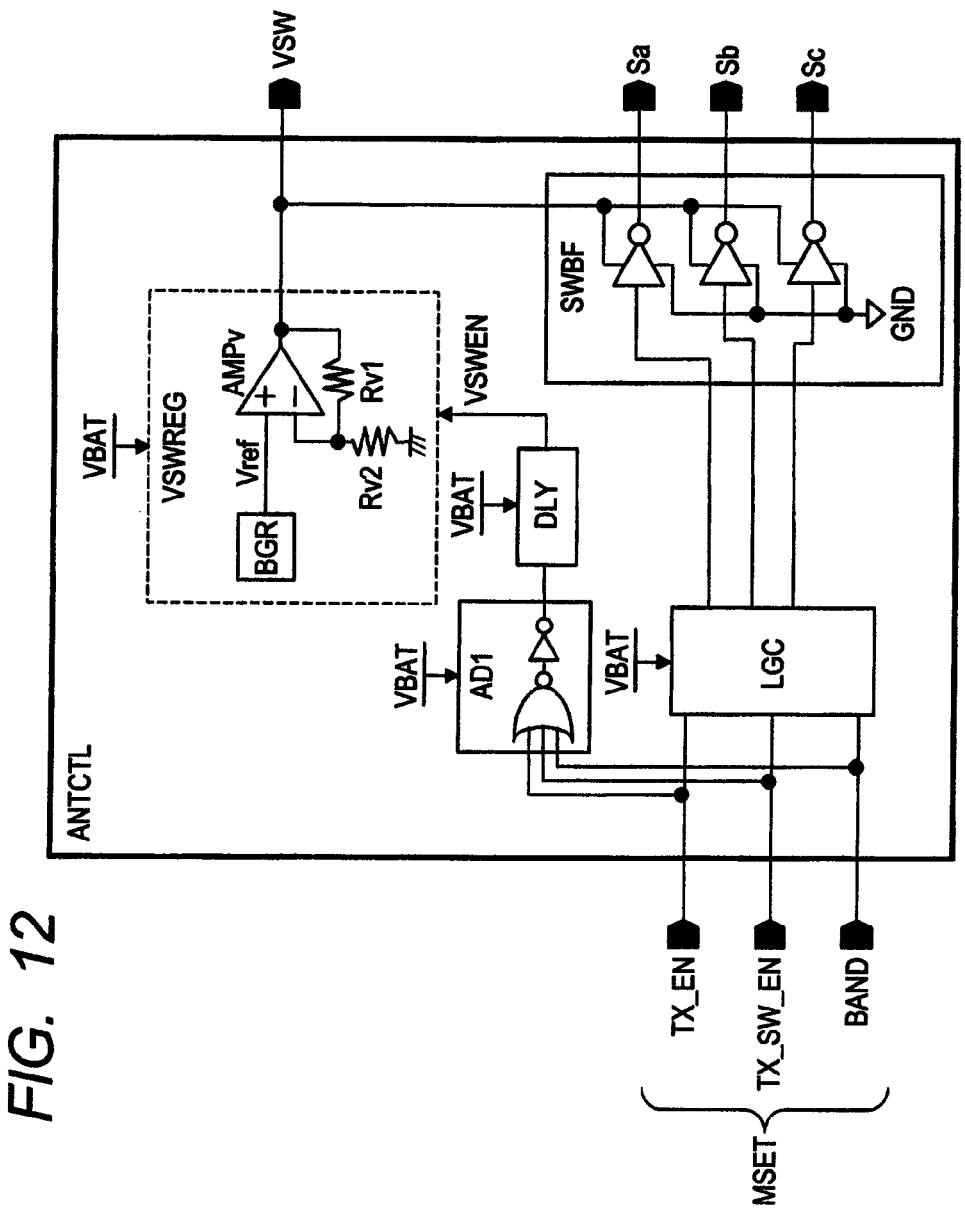
FIG. 12 is a block diagram showing a schematic configuration example of an antenna control circuit in the radio frequency module shown in FIG. 3.

FIG. 12 is a block diagram showing a schematic configuration example of the antenna control circuit ANTCTL in the radio frequency module RFMDL shown in FIG. 3. The antenna control circuit ANTCTL shown in FIG. 12 includes a control logic circuit LGC, an antenna switch buffer circuit SWBF, an antenna switch power supply voltage generation circuit VSWREG, an AND operation circuit AD1, and a delay circuit DLY. The circuit LGC operates at the battery power VBAT, performs decode processing etc. on the operation mode setting signal MSET inputted from the baseband unit BBU in FIG. 3, and generates output signals to the circuit SWBF. In FIG. 12, the signal MSET is configured with a transmission enable signal TX_EN, a transmission switch enable signal TX_SW_EN, and a band selection signal BAND.

The antenna switch power supply voltage generation circuit VSWREG is a so-called power regulator circuit, operates at the battery power VBAT, and generates the power supply voltage VSW (e.g., 3.0 V). Although not limited in particular, the circuit VSWREG includes a reference voltage generation circuit (bandgap reference circuit) BGR, an amplifier circuit AMPv, and feedback resistors Rv1 and Rv2. A fixed voltage Vref from the circuit BGR is inputted to the positive input node of the circuit AMPv, and a voltage obtained by dividing the output voltage of the circuit AMPv by the resistors Rv1 and Rv2 is inputted to the negative input node. By appropriately adjusting the division ratio between the resistors Rv1 and Rv2, the circuit AMPv outputs the voltage VSW (={(Rv1+Rv2)/Rv2}×Vref) such as 3.0 V. The circuit VSWREG has a configuration that can control whether or not to generate the voltage VSW in accordance with the state of a power generation enable signal VSWEN. Although not limited in particular, this can be easily achieved by controlling the activation or deactivation of the circuit AMPv (e.g., the presence or absence of bias supply).

The antenna switch buffer circuit SWBF includes, for example, a plurality of inverter circuits which operate at the voltage VSW from the circuit VSWREG. The circuit SWBF converts the output signals having the amplitude voltage between VBAT and GND inputted from the circuit LGC, and outputs the antenna control signals Sa, Sb, Sc having the amplitude voltage between VSW and GND. The AND operation circuit AD1 operates at the battery power VBAT, and performs an AND operation on the three input signals TX_EN, TX_SW_EN, and BAND. Although details will be described later, the circuit AD1 functions as a detection circuit for a sleep instruction. The delay circuit DLY operates at the battery power VBAT, delays the output signal of the circuit AD1 by a predetermined time period, and outputs the power generation enable signal VSWEN.

Figure 13A:
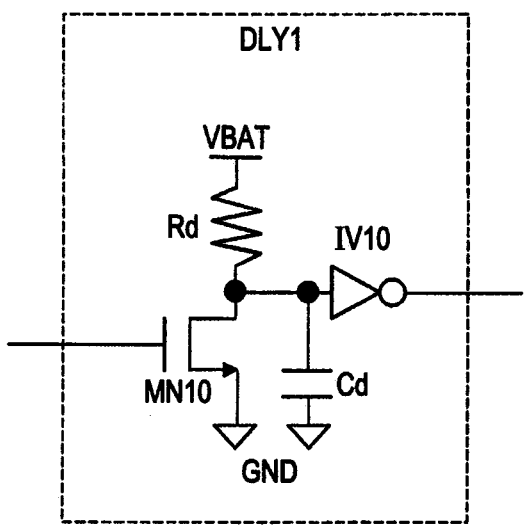
FIGS. 13A and 13B are circuit diagrams showing different detailed configuration examples of a delay circuit in the antenna control circuit shown in FIG. 12.
Figure 13B:
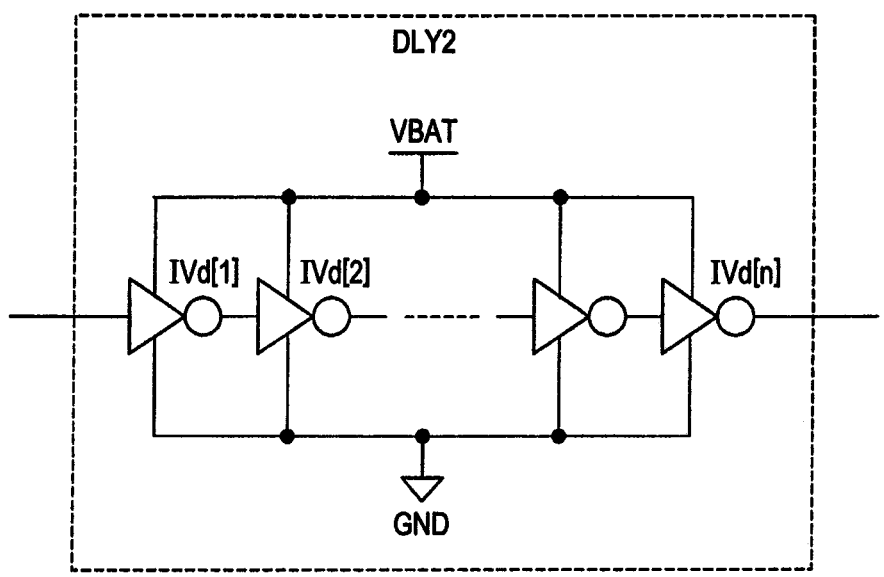

FIGS. 13A and 13B are circuit diagrams showing different detailed configuration examples of the delay circuit DLY in the antenna control circuit ANTCTL shown in FIG. 12. An RC delay circuit DLY1 shown in FIG. 13A includes an n-channel MOS transistor MN10, a resistor Rd, a capacitor Cd, and an inverter circuit IV10. In the transistor MN10, a source is coupled to the ground GND, and a drain is coupled to the input node of the circuit IV10. In the resistor Rd, one end is coupled to the battery power VBAT, and the other end is coupled to the input node of the circuit IV10. In the capacitor Cd, one end is coupled to the ground GND, and the other end is coupled to the input node of the circuit IV10. When the output signal of the circuit AD1 shown in FIG. 12 transitions from the 'H' level to the 'L' level, the output of the circuit IV10 transitions from the 'H' level to the 'L' level after a lapse of a time period (Twait) determined by the time constant of Rd and Cd. When the output signal of the circuit AD1 transitions from the 'L' level to the 'H' level inversely, the output of the circuit IV10 transitions from the 'L' level to the 'H' level after a lapse of a time period sufficiently shorter than Twait.

On the other hand, a cascaded inverter delay circuit DLY2 shown in FIG. 13B operates at the battery power VBAT, and is configured with a plurality of inverter circuits IVd[1], IVd[2], ..., IVd[n] (n is an even number) which are cascade-coupled in sequence. When the output signal of the circuit AD1 transitions from the 'H' level to the 'L' level or from the 'L' level to the 'H' level, the output of the circuit IVd[n] transitions from the 'H' level to the 'L' level or from the 'L' level to the 'H' level respectively after a lapse of a time period (Twait) determined by the delay time of the circuits IVd[1] to IVd[n].

With this, in the antenna control circuit ANTCTL shown in FIG. 12, when the operation mode setting signal MSET {TX_EN, TX_SW_EN, BAND} from the unit BBU transitions from a combination other than {'L', 'L', 'L'} to {'L', 'L', 'L'}, the signal VSWEN transitions from the 'H' level to the 'L' level after a lapse of the time period Twait. The circuit VSWREG generates the power supply voltage VSW (i.e., is activated) when the signal VSWEN is at the 'H' level, and stops generating the voltage VSW (i.e., is deactivated) when the signal VSWEN is at the 'L' level. When the signal MSET {TX_EN, TX_SW_EN, BAND} transitions from {'L', 'L', 'L'} to a combination other than {'L', 'L', 'L'} inversely, the signal VSWEN transitions from the 'L' level to the 'H' level after a lapse of the time period Twait or less.

FIG. 14 is a truth table showing a detailed operation example of the control logic circuit LGC in the antenna control circuit ANTCTL shown in FIG. 12. In FIG. 14, in addition to the operation example of the control logic circuit LGC, the states of the switch on-off signals in FIG. 6 generated in accordance with outputs thereof (i.e., corresponding to an operation example of the decoder circuit DEC in FIG. 6) are also shown.

For example, the baseband unit BBU outputs {'1', '1', '0'} as the operation mode setting signal MSET {TX_EN, TX_SW_EN, BAND} to designate a low-band transmission operation mode TXMD1(LB). In response thereto, the circuit ANTCTL generates and supplies the power supply voltage VSW (VSW='1'), and outputs {'0', '0', '1'} as {Sc, Sb, Sa} through the use of the control logic circuit LGC. In response thereto, the antenna switch ANTSW shown in FIG. 6 drives the signals TXLBT, TXHBS, RXHBS, and RXLBS of the eight switch on-off signals to the VSW level ('H'), and drives the remaining four signals to the −VSS level ('L'). Thereby, the through transistor (TSW2a) during low-band transmission in FIG. 9 is turned on, and the remaining through transistors are turned off. Further, the shunt transistor (TSW1a) during low-band transmission is turned off, and the remaining shunt transistors are turned on.

In FIG. 14, in the other modes (LB ISOMD, HB ISOMD, TXMD2(HB), RXMD2(HB), RXMD1(LB), ISOMD) as well as in the mode TXMD1(LB), an operation mode is designated by a combination of {TX_EN, TX_SW_EN, BAND} from the unit BBU, and the switch on-off signals corresponding thereto are generated. The modes "LB ISOMD", "HB ISOMD", and "ISOMD" are a low-band isolation operation mode, a high-band isolation operation mode, and a normal isolation operation mode (idle mode), respectively. In any of the operation modes, all the through transistors in FIG. 9 are turned off, and all the shunt transistors are turned on.

The mode TXMD2(HB) is a high-band transmission operation mode. In the mode TXMD2(HB), the through transistor (TSW2b) during high-band transmission in FIG. 9 is turned on, and the remaining through transistors are turned off. Further, the shunt transistor (TSW1b) during high-band transmission is turned off, and the remaining shunt transistors are turned on.

The mode RXMD2(HB) is a high-band reception operation mode. In the mode RXMD2(HB), the through transistor (TSW3b) during high-band reception in FIG. 9 is turned on, and the remaining through transistors are turned off. Further, the shunt transistor (TSW4b) during high-band reception is turned off, and the remaining shunt transistors are turned on.

The mode RXMD1(LB) is a low-band reception operation mode. In the mode RXMD1(LB), the through transistor (TSW3a) during low-band reception in FIG. 9 is turned on, and the remaining through transistors are turned off. Further, the shunt transistor (TSW4a) during low-band reception is turned off, and the remaining shunt transistors are turned on.

On the other hand, the unit BBU outputs {'0', '0', '0'} as {TX_EN, TX_SW_EN, BAND} to designate the power saving operation mode (sleep mode) SLPMD (issue a sleep instruction). In response thereto, the circuit ANTCTL stops the generation and supply of the power supply voltage VSW (VSW='0'), and outputs {'0', '0', '0'} as {Sc, Sb, Sa} through the use of the control logic circuit LGC. In response thereto, in the antenna switch ANTSW shown in FIG. 6, the eight switch on-off signals become high impedance. However, with the use of the antenna control circuit ANTCTL shown in FIG. 12, when the sleep instruction is issued from the unit BBU, the signals {Sc, Sb, Sa} become {'0', '0', '0'} instantly by the circuit LGC, but the power supply voltage VSW falls off after a lapse of the given time period (Twait) from the issue of the sleep instruction as described above. Therefore, since {VSW, Sc, Sb, Sa}={'1', '0', '0', '0'} during the time period (Twait), in reality the module operates in the isolation operation mode ISOMD and transitions to the sleep mode SLPMD after a lapse of the time period Twait. This can easily achieve the operation shown in FIG. 1.

Further, in FIG. 12, in the sleep mode SLPMD, the control logic circuit LGC outputs the three H-level (VBAT-level) signals using the battery power VBAT, and these signals are inverted by the inverter circuits in the switch buffer circuit SWBF, so that {'0', '0', '0'} are outputted as {Sc, Sb, Sa}. At this time, in the circuit SWBF, even though the supply of the voltage VSW is stopped after a lapse of the time period Twait, the H-level inputs continue so that {'0', '0', '0'} of the GND level can be outputted with reliability. In this embodiment, the operation modes in which the generation and supply of the power supply voltage VSW are performed in FIG. 14 (i.e., operation modes other than the sleep mode SLPMD) are referred to as the normal operation mode.

Figure 15A:
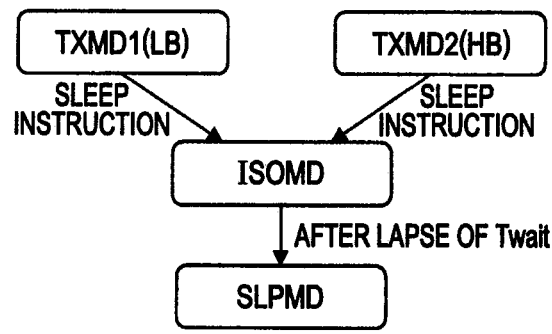
Figure 15B:
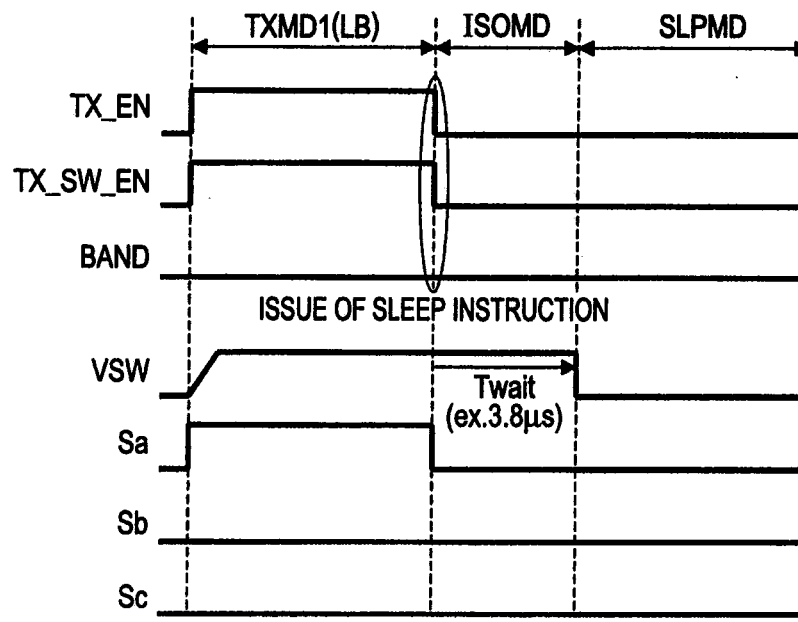

FIGS. 15A and 15B show a characteristic operation example extracted in association with FIG. 14, in which FIG. 15A is a state transition diagram, and FIG. 15B is an operation waveform chart. As shown in FIG. 15A, the radio frequency module RFMDL according to this embodiment, at the time of receiving the sleep instruction in the low-band or high-band transmission operation mode TXMD1(LB) or TXMD2(HB), transitions to the isolation operation mode ISOMD temporarily, and transitions to the sleep mode SLPMD after a lapse of the time period Twait in the isolation operation mode. FIG. 15B shows each operation waveform example when the module receives the sleep instruction in the mode TXMD1(LB). The unit BBU causes the operation mode setting signal MSET {TX_EN, TX_SW_EN, BAND} to transition from {'1', '1', '0'} to {'0', '0', '0'}, thereby instructing transition from the transmission operation mode to the sleep mode.

In response to the sleep instruction, in the antenna control circuit ANTCTL shown in FIG. 12, the antenna control signals (Sa, Sb, Sc) transition from {'1', '0', '0'} to {'0', '0', '0'} through the control logic circuit LGC and the switch buffer circuit SWBF. On the other hand, the deactivation of the power supply voltage VSW (transition of the power generation enable signal VSWEN from the 'H' level to the 'L' level) is performed after a lapse of the given time period (Twait) from the issue of the sleep instruction. Thereby, after the isolation operation mode ISOMD is performed during the time period Twait, transition to the sleep mode SLPMD is performed.

In FIG. 15B, the time period Twait (delay time of the delay circuit DLY shown in FIG. 12) is, e.g., 3.8 µs. This can be achieved, for example, by setting the resistor Rd to several hundreds of kΩ and the capacitor Cd to about 10 pF in the configuration example shown in FIG. 13A. In the requirement, a fall time from the issue of the sleep instruction to actual transition to the sleep mode SLPMD is not more than 6.9 µs, whereas a rise time from the issue of an instruction for return to the normal operation mode to actual transition to the mode is not more than 5 µs to secure characteristics. As described above, in the circuit DLY1 shown in FIG. 13A, there occurs little delay at the time of rising. Therefore, to meet the requirement, the delay time of the circuit DLY needs to be less than about 7 µs (e.g., 6.9 µs); however, too short a delay time may cause insufficient switching to the mode ISOMD. For this reason, the delay time is set to 3.8 µs or the like, so that it becomes possible to sufficiently meet the requirement and also sufficiently switch to the mode ISOMD, even in consideration of variation in the circuits DLY1 and DLY2 shown in FIG. 13A, the fall time of the circuit VSWREG shown in FIG. 12, and the like.

Further, for example in GSM, TDMA (Time Division Multiple Access) is used, and operation modes are switched in units of time periods called time slots. The time period of one slot is 577 µs, and the mode SLPMD is performed continuously for a time period of at least one slot. In FIG. 15B, the mode ISOMD is performed for a time period of 3.8 µs, over which the gate capacitance of the n-channel MOS transistor shown in FIG. 10 is charged and discharged to the VSW level (on level) or the –VSS level (off level). After that, when the module transitions to the mode SLPMD, the gate becomes e.g. high impedance, and the on level or the off level is maintained by the gate capacitance.

The value of the gate capacitance Cg can be determined by approximately $Cox \cdot L \cdot W$ where Cox is a capacitance value per unit area of the gate insulating film GOX, L is a gate length, and W is a gate width. In general, the size (e.g., gate width W) of the switch transistors TSW in the radio frequency switch circuit RFSW is formed largely in order to reduce the on-resistance, which increases the value of the gate capacitance Cg. Consequently, by sufficiently charging and discharging the capacitance Cg for a time period of 3.8 µs, it is possible to maintain the on level or the off level for some time period even if the mode SLPMD is performed continuously for a time period of one slot or more. According to examination by the present inventors et al., it is possible to maintain the level, e.g., for a time period of about 4 ms with a shunt transistor size of 480 µm and a gate capacitance of 0.1 pF, and this value is sufficient for practical use.

Detailed Example of Level Shift Circuit

Figure 16:
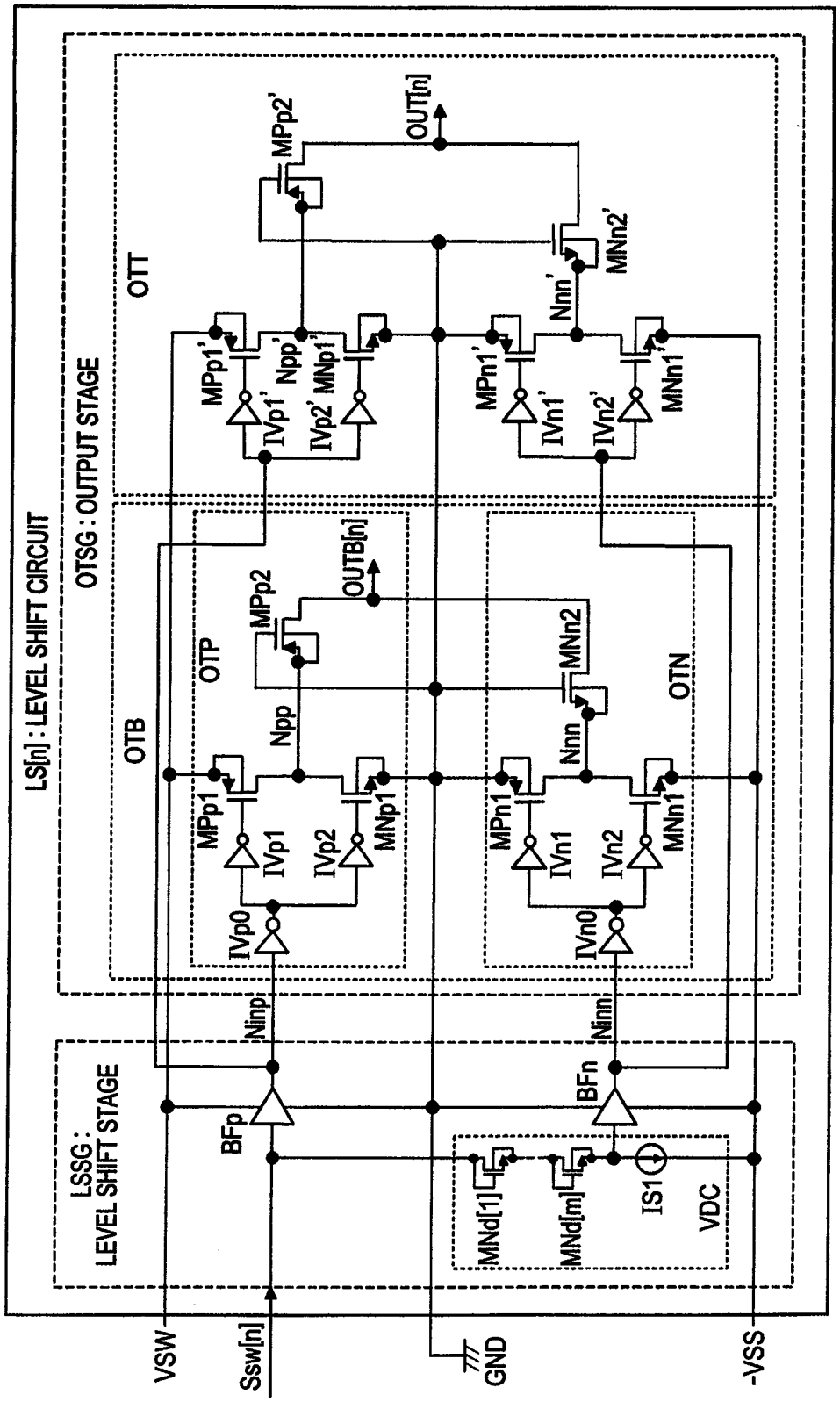
FIG. 16 is a circuit diagram showing a detailed configuration example of each level shift circuit in a level shift circuit block in the antenna switch shown in FIG. 6.

FIG. 16 is a circuit diagram showing a detailed configuration example of each level shift circuit LS[n] in the level shift circuit block LSBK in the antenna switch ANTSW shown in FIG. 6. The level shift circuit LS[n] (n=1 to 4) shown in FIG. 16 is configured with a level shift stage LSSG and an output stage OTSG. The stage LSSG includes a voltage drop circuit VDC and buffer circuits BFp and BFn.

The circuit BFp operates at the power supply voltage VSW and the ground GND. The switch control signal Ssw[n] having the amplitude voltage between VSW and GND outputted from the decoder circuit DEC is inputted to the circuit BFp, and the circuit BFp outputs a signal having the amplitude voltage between VSW and GND to a node Ninp. The circuit BFn operates at the ground GND and the negative power supply voltage (–VSS). The signal Ssw[n] is inputted through the circuit VDC to the circuit BFn, and the circuit BFn outputs a signal having the amplitude voltage between GND and –VSS to a node Ninn.

The circuit VDC includes, for example, a plurality of diode-coupled (gate-drain shorted) n-channel MOS transistors MNd[1] to MNd[m] and a current source IS1. The transistors MNd[1] to MNd[m] are series-coupled in sequence between the input node of the signal Ssw[n] and the input node of the circuit BFn, and the current source IS1 is provided between the input node of the circuit BFn and the voltage –VSS. With this, the circuit VDC drops the amplitude of the signal Ssw[n] by approximately the sum of the threshold voltages of the transistors MNd[1] to MNd[m], and generates a signal having approximately the amplitude voltage between GND and –VSS at the input node of the circuit BFn.

In FIG. 16, the output stage OTSG includes a first circuit block OTT for outputting a control signal OUT[n] to the radio frequency switch circuit RFSW and a second circuit block OTB for outputting a control signal OUTB[n] which is the inversion signal of the signal OUT[n]. For example, in the case of the circuit LS[1] in FIG. 6 as n=1, the signals OUT[1] and OUTB[1] correspond to the signals TXLBT and TXLBS respectively. The circuit block OTB includes inverter circuits IVp0 to IVp2, IVn0 to IVn2, p-channel MOS transistors MPp1, MPp2, MPn1, and n-channel MOS transistors MNn1, MNn2, MNp1. The circuits IVp0 to IVp2 and the transistors MPp1, MPp2, MNp1 configure a circuit (first output circuit OTP) of the amplitude voltage between GND and VSW, and the circuits IVn0 to IVn2 and the transistors MNn1, MNn2, MPn1 configure a circuit (second output circuit OTN) of the amplitude voltage between –VSS and GND. Further, the transistors MPp1, MPp2, MPn1, MNn1, MNn2, MNp1 have characteristics of an enhancement type.

In the circuit (OTP) of the amplitude voltage between GND and VSW, the circuit IVp0 performs an inversion operation with the node Ninp as the input. The circuit IVp1 performs an inversion operation in response to the output of the circuit IVp0 and controls the gate of the transistor MPp1, and the circuit IVp2 performs an inversion operation in response to the output of the circuit IVp0 and controls the gate of the transistor MNp1. The source-drain paths of the transistors MPp1 and MNp1 are coupled in series between VSW and GND, and their common coupling node (drain node) Npp is coupled to the source of the transistor MPp2 having a gate coupled to the ground GND. The signal OUTB[n] is outputted from the drain of the transistor MPp2.

On the other hand, similarly in the circuit (OTN) of the amplitude voltage between −VSS and GND, the circuit IVn0 performs an inversion operation with the node Ninn as the input. The circuit IVn1 performs an inversion operation in response to the output of the circuit IVn0 and controls the gate of the transistor MPn1, and the circuit IVn2 performs an inversion operation in response to the output of the circuit IVn0 and controls the gate of the transistor MNn1. The source-drain paths of the transistors MPn1 and MNn1 are coupled in series between GND and −VSS, and their common coupling node (drain node) Nnn is coupled to the source of the transistor MNn2 having a gate coupled to the ground GND. The signal OUTB[n] is outputted from the drain of the transistor MNn2.

With this, in the circuit (OTP) of the amplitude voltage between GND and VSW, when the node Ninp is at the 'L' level (GND level), the signal OUTB[n] becomes the VSW level through the transistors MPp1 and MPp2. When the node Ninp is at the 'H' level (VSW level), the transistor MNp1 is turned on and the transistor MPp2 is turned off, so that the signal OUTB[n] becomes high impedance. On the other hand, in the circuit (OTN) of the amplitude voltage between −VSS and GND, when the node Ninn is at the 'L' level (−VSS level), the transistor MNn2 is turned off, so that the signal OUTB[n] becomes high impedance. When the node Ninn is at the 'H' level (GND level), the signal OUTB[n] becomes the −VSS level through the transistors MNn1 and MNn2. Therefore, the signal OUTB[n] of the amplitude voltage between −VSS and VSW is generated.

The circuit block OTT includes inverter circuits IVp1', IVp2' IVn1' IVn2', p-channel MOS transistors MPp1', MPp2', MPn1', and NMOS transistors MNn1', MNn2', MNp1'. The block OTT has the same configuration as the block OTB except that the block OTT does not have the inverter circuits IVp0 and IVn0 included in the input part of the block OTB, and performs the same operation. That is, the node Ninp is directly coupled to the input of the circuits IVp1' and IVp2' without the circuit IVp0, and the node Ninn is directly coupled to the input of the circuits IVn1' and IVn2' without the circuit IVn0. With this, the block OTT outputs the control signal OUT[n] having a different polarity from that of the signal OUTB[n].

Figure 17A:
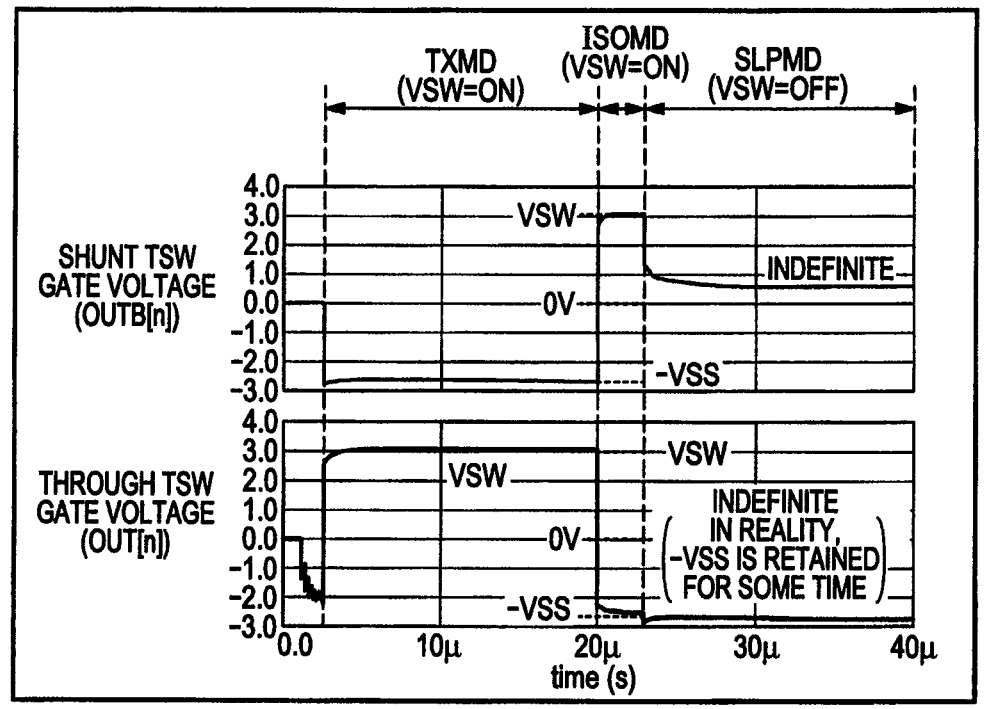
Figure 17B:
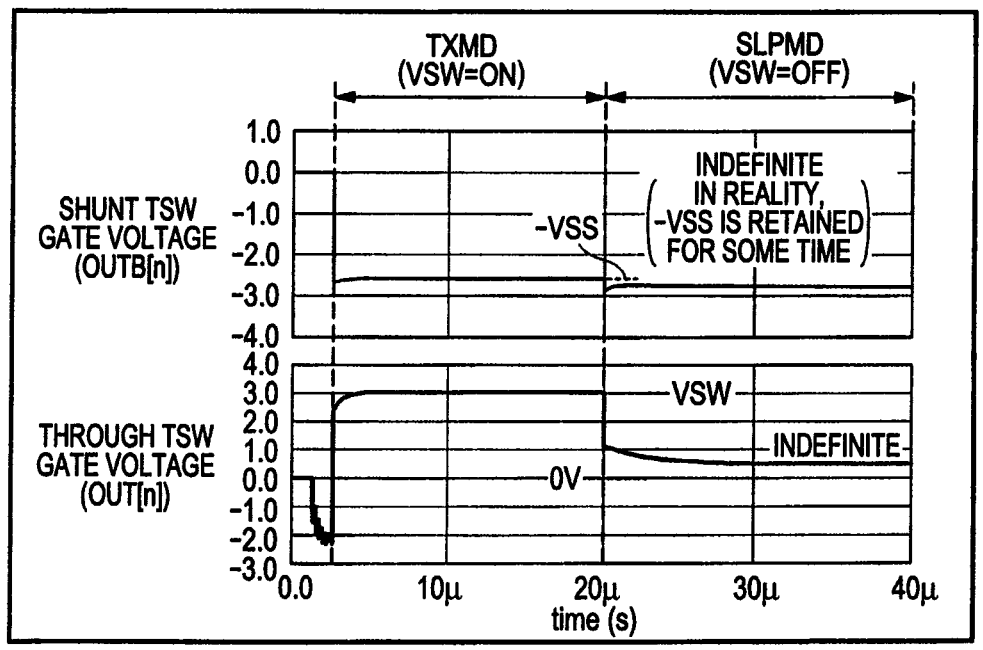

FIGS. 17A and 17B show actual transition examples of the output voltage in the level shift circuit LS[n] shown in FIG. 16, in which FIG. 17A shows the case of using the operation example shown in FIG. 1, and FIG. 17B shows the case of using the operation example shown in FIG. 2 as a comparison example. First, in FIG. 17B as the comparison example, there are shown the gate voltage (corresponding to the signal OUTB[n] in FIG. 16) of the shunt transistor (TSW1 in FIGS. 1 and 2) and the gate voltage (corresponding to the signal OUT[n]) of the through transistor (TSW2) at the time of transition from the transmission operation mode TXMD to the sleep mode SLPMD. During the mode TXMD, the transistors MNn1 and MNn2 in FIG. 16 are turned on and the transistor MPn1 is turned off, so that the signal OUTB[n] becomes the −VSS level (e.g., −2.6 V), which turns off the shunt transistor. Then, at the time of transition from the mode TXMD to the mode SLPMD, the negative voltage generation circuit VSSGEN in FIGS. 6 and 7 stops generating the voltage −VSS. However, since the voltage −VSS is retained for some time by the capacitors C1 and C2 shown in FIGS. 6 and 7, the signal OUTB[n] maintains approximately the −VSS level through the transistors MNn1 and MNn2 whose gates are at the GND level.

Further, during the mode TXMD, the transistors MPp1' and MPp2' are turned on and the transistor MNp1' is turned off, so that the signal OUT[n] becomes the VSW level (e.g., 3.1 V), which turns on the through transistor. Then, at the time of transition from the mode TXMD to the mode SLPMD, the supply of the voltage VSW is stopped (VSW decreases toward 0 V), so that a potential at a node Npp' decreases through the transistor MPp1', and the signal OUT[n] also decreases through the transistor MPp2'. Accordingly, the gate-source potential difference Vgs of the transistors MPp1' and MPp2' decreases so that the voltage of the node Npp' and the signal OUT[n] decreases to about the threshold voltage Vthp' (e.g., 0.7 V) of the transistors MPp1' and MPp2'. When the voltage of the node Npp' and the signal OUT[n] falls below the voltage Vthp', the transistors MPp1' and MPp2' are turned off, so that the signal OUT[n] becomes high impedance and maintains about the level of the voltage Vthp'. Therefore, during the mode SLPMD, the shunt transistor maintains the off state with the −VSS level of the signal OUTB[n], and the through transistor (depression type) maintains the on state with approximately the Vthp' level of the signal OUT[n], which may cause a reduction in isolation characteristics.

On the other hand, in FIG. 17A according to this embodiment, transition is performed from the transmission operation mode TXMD through the isolation operation mode ISOMD to the sleep mode SLPMD. During the mode ISOMD, the transistors MPp1 and MPp2 are turned on and the transistor MNp1 is turned off, so that the signal OUTB[n] becomes the VSW level (e.g., 3.1 V), which turns on the shunt transistor. Then, at the time of transition from the mode ISOMD to the mode SLPMD, the supply of the voltage VSW is stopped (VSW decreases toward 0 V), so that a potential at the node Npp decreases through the transistor MPp1, and the signal OUTB[n] also decreases through the transistor MPp2. Accordingly, the gate-source potential difference Vgs of the transistors MPp1 and MPp2 decreases, so that the voltage of the node Npp and the signal OUTB[n] decreases to about the threshold voltage Vthp (e.g., 0.7 V) of the transistors MPp1 and MPp2. When the voltage of the node Npp and the signal OUTB[n] falls below the voltage Vthp, the transistors MPp1 and MPp2 are turned off, so that the signal OUTB[n] becomes high impedance and maintains about the level of the voltage Vthp.

Further, during the mode ISOMD, the transistors MNn1' and MNn2' in FIG. 16 are turned on and the transistor MPn1' is turned off, so that the signal OUT[n] becomes the −VSS level (e.g., −2.6 V), which turns off the through transistor. Then, at the time of transition from the mode ISOMD to the mode SLPMD, the negative voltage generation circuit VSS-GEN in FIGS. 6 and 7 stops generating the voltage −VSS. However, since the voltage −VSS is retained for some time by the capacitors C1 and C2 shown in FIGS. 6 and 7, the signal OUT[n] maintains approximately the −VSS level through the transistors MNn1' and MNn2' whose gates are at the GND level. Therefore, during the mode SLPMD, the shunt transistor (depression type) maintains the on state with approximately the Vthp level of the signal OUTB[n], and the through transistor maintains the off state with the −VSS level of the signal OUT[n], which can enhance isolation characteristics.

General Configuration of Wireless Communication System

FIG. 18 is a block diagram showing a configuration example of a wireless communication system employing the radio frequency module according to an embodiment of the invention. In FIG. 18, a cellular phone system is shown as an example of the wireless communication system. The cellular phone system shown in FIG. 18 includes a baseband unit BBU, a radio frequency system unit RFSYS, an antenna ANT, a speaker SPK, and a microphone MIC. The unit BBU converts analog signals, e.g., used by the speaker SPK and the microphone MIC into digital signals, performs various kinds of digital signal processing (modulation, demodulation, digital filtering, etc.) associated with communication, and outputs various kinds of control signals associated with communication. The control signals include the operation mode setting signal MSET for switching various operation modes such as transmission and reception and a power designation signal for designating a transmission power.

The unit RFSYS includes a radio frequency signal processing unit RFBK, a SAW (Surface Acoustic Wave) filter, and the radio frequency module RFMDL. The unit RFBK includes, for example, a transmission mixer circuit, a reception mixer circuit, and a low-noise amplifier circuit, and performs frequency conversion (upconversion, downconversion) between a baseband signal mainly used by the unit BBU and a radio frequency signal used by the module RFMDL. The module RFMDL is implemented, for example, by a single module wiring board, over which a high power amplifier circuit block HPABK, a coupler CPL, a low-pass filter LPF, an antenna switch ANTSW, and the like are mounted. The block HPABK and the antenna switch ANTSW are implemented, for example, by the respective single semiconductor chips, as shown in FIG. 4 etc.

The block HPABK includes a high power amplifier circuit HPA for amplifying a transmission signal outputted from the transmission mixer circuit or the like in the unit RFBK and an automatic power control circuit APC for controlling a transmission power. The coupler CPL detects the transmission power of the circuit HPA and outputs the detection result. The circuit APC controls the circuit HPA based on the signal Vramp informed from the unit BBU and the detection result by the coupler CPL. The filter LPF performs filtering and impedance matching on the transmission signal of the circuit HPA, and outputs the processed signal to the antenna switch ANTSW. The antenna switch ANTSW switches the switches based on the signal MSET from the unit BBU, sends a transmission radio frequency signal (RFtx) to the antenna ANT, and sends a reception radio frequency signal (RFrx) from the antenna ANT to the SAW filter. The SAW filter extracts only a necessary band from the signal RFrx, and outputs it to the unit RFBK. In the unit RFBK, the low-noise amplifier circuit amplifies the received signal from the SAW filter, and the reception mixer circuit converts the amplified signal into a baseband signal.

Comparison Example of Level Shift Circuit

Figure 19:
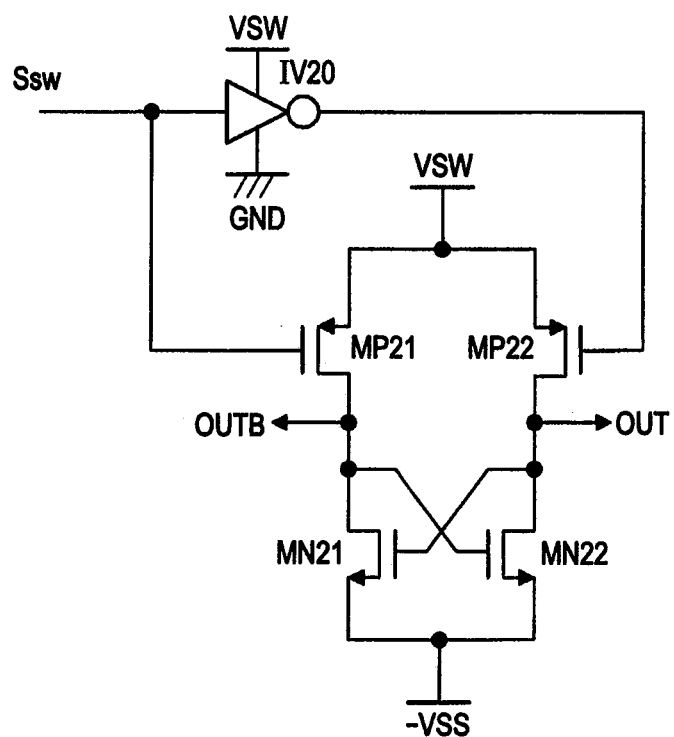
FIG. 19 is a circuit diagram showing a comparison example of the level shift circuit shown in FIG. 16.

FIG. 19 is a circuit diagram showing a comparison example of the level shift circuit shown in FIG. 16. While FIG. 16 shows the configuration example of the level shift circuit using MOS transistors having low device breakdown voltage; if it is possible to use MOS transistors having high device breakdown voltage, it is possible to use a cross-coupled level shift circuit such as shown in FIG. 19. The level shift circuit shown in FIG. 19 includes p-channel MOS transistors MP21 and MP22, n-channel MOS transistors MN21 and MN22, and an inverter circuit IV20. The sources of the transistors MP21 and MP22 are coupled in common to the power supply voltage VSW, the drain of the transistor MP21 is coupled to the drain of the transistor MN21, and the drain of the transistor MP22 is coupled to the drain of the transistor MN22. The sources of the transistors MN21 and MN22 are coupled in common to the negative power supply voltage (−VSS), and cross-coupling is performed (the gate of one transistor is coupled to the drain of the other transistor). The gate of the transistor MP21 is controlled by the switch control signal Ssw, and the gate of the transistor MP22 is controlled by the inversion signal of the signal Ssw inverted by the circuit IV20. The circuit IV20 operates between the voltages VSW and GND.

With such a configuration example, in accordance with the logic level of the signal Ssw, the control signal OUT having the amplitude voltage between VSW and −VSS can be generated at the drain of the transistor MP22 (MN22), and the control signal OUTB of the opposite polarity can be generated at the drain of the transistor MP21 (MN21). In this case, since the signal having the amplitude voltage between VSW and −VSS is applied between the gate and source and between the source and drain of each MOS transistor, high device breakdown voltage is required for each MOS transistor. Therefore, if it is not easy to secure the device breakdown voltage such as in the SOI substrate, it is desirable to use the configuration example shown in FIG. 16. However, even if such a configuration example as shown in FIG. 19 is applicable, it is advantageous to use the operation example shown in FIG. 1 etc.

That is, assume that the supply of the voltages VSW and −VSS is stopped in a state where the signal OUT is at the VSW level and the signal OUTB is at the −VSS level. In this case, the voltage of the signal OUT decreases through the transistor MP22. When the voltage of the signal OUT reaches the threshold voltage of the transistor MP22, the transistor MP22 is turned off, and the signal OUT becomes high impedance and maintains approximately the threshold voltage. On the other hand, since the voltage −VSS is retained for some time by the capacitors C1 and C2, and the voltage of the signal OUT (approximately the threshold voltage of the transistor MP22) is supplied to the gate of the transistor MN21, the signal OUTB maintains approximately the voltage −VSS through the turned-on transistor MN21. Thus, if the gate level of the switch transistor TSW immediately before the sleep mode is at the VSW level, the gate level is maintained at approximately the threshold voltage level thereafter. If the gate level is at the −VSS level, the gate level is maintained at the −VSS level thereafter. Therefore, the same as in FIGS. 16 and 17 holds for this case.

However, if the negative power supply voltage (−VSS) becomes 0 V early (e.g., the power supply capacitance is small or the duration time of the sleep mode is long), operations differ between the configuration examples shown in FIGS. 16 and 19. In the configuration example shown in FIG. 19, the gate of the transistor TSW transitions from the −VSS level to the 0V level. On the other hand, in the configuration example shown in FIG. 16, when the gate of the transistor TSW reaches a −Vthn level from the −VSS level where Vthn is the threshold voltage of the transistors MNn2 and MNn2', the gate becomes high impedance and maintains the −Vthn level. Accordingly, in the case of using the depression-type transistor TSW, the use of the configuration example shown in FIG. 19 may cause the through transistor to transition from the off state to the on state during the sleep mode, whereas the use of the configuration example shown in FIG. 16 enables the through transistor to maintain the off state for some time.

While the invention made above by the present inventors has been described specifically based on the illustrated embodiments, the present invention is not limited thereto, and various changes and modifications can be made thereto without departing from the spirit and scope of the invention.

For example, while in the above embodiment, the operation example shown in FIG. 1 is implemented by inserting the sleep instruction detection circuit (AD1) and the delay circuit DLY in the antenna control circuit ANTCTL as shown in FIG. 12, the implementation can be changed as appropriate. For example, the control logic circuit LGC shown in FIG. 12 is configured with a state machine or the like, and state transition such as shown in FIG. 15A can be implemented in the state machine. Further, in the baseband unit BBU, transition from the transmission operation mode to the sleep mode can be converted into transition from the transmission operation mode through the isolation operation mode to the sleep mode. However, in this case, it is necessary to combine a specific baseband unit BBU with the radio frequency module RFMDL; therefore, it is desirable to have the conversion function in the module RFMDL for an arbitrary combination of the unit BBU and the module RFMDL.

Further, while in this embodiment, the antenna switch ANTSW is formed over the SOI substrate, the antenna switch ANTSW can also be formed over an SOS (Silicon on Sapphire) substrate. Furthermore, while in this embodiment, the high power amplifier circuit block HPABK and the antenna switch ANTSW are implemented over the separate chips, the block HPABK and the antenna switch ANTSW can also be implemented over the same semiconductor chip for higher integration. Further, while in this embodiment, the high power amplifier circuit HPA is formed with the LDMOSFET, the circuit HPA can also be formed with an HBT (Hetero Junction Bipolar Transistor) or the like.

What is claimed is:

1. A radio frequency module comprising:
a power amplifier circuit for amplifying a transmission radio frequency signal and outputting an amplified signal to a transmission node;
a first transistor for coupling the transmission node to an antenna;
a second transistor for shunting the transmission node to a first power supply voltage; and
first control circuitry which generates a second power supply voltage higher than the first power supply voltage and a third power supply voltage lower than the first power supply voltage and performs on-off control of the first and second transistors by applying a control signal having a value of the second power supply voltage or the third power supply voltage to the first and second transistors, wherein:
when a transmission operation mode is designated, the first control circuitry turns on the first transistor and turns off the second transistor, and
when a power saving operation mode is designated after the transmission operation mode, the first control circuitry turns off the first transistor and turns on the second transistor for a first time period and then stops generation of the second and third power supply voltages.

2. The radio frequency module according to claim 1, wherein the first and second transistors are n-channel MIS transistors,
wherein the first power supply voltage is a ground voltage,
wherein the second power supply voltage is a positive power supply voltage, and
wherein the third power supply voltage is a negative power supply voltage.

3. The radio frequency module according to claim 2, wherein the first control circuitry includes:
a first driver circuit which operates between the second power supply voltage and the first power supply voltage;
a second driver circuit which operates between the first power supply voltage and the third power supply voltage;
a first switch circuit which is inserted between an output node of the first driver circuit and a control input node of the first transistor and which is turned on when the first driver circuit outputs the second power supply voltage and turned off when the first driver circuit outputs the first power supply voltage;
a second switch circuit which is inserted between an output node of the second driver circuit and the control input node of the first transistor and which is turned on when the second driver circuit outputs the third power supply voltage and turned off when the second driver circuit outputs the first power supply voltage;
a third driver circuit which operates between the second power supply voltage and the first power supply voltage;
a fourth driver circuit which operates between the first power supply voltage and the third power supply voltage;
a third switch circuit which is inserted between an output node of the third driver circuit and a control input node of the second transistor and which is turned on when the third driver circuit outputs the second power supply voltage and turned off when the third driver circuit outputs the first power supply voltage; and
a fourth switch circuit which is inserted between an output node of the fourth driver circuit and the control input node of the second transistor and which is turned on when the fourth driver circuit outputs the third power supply voltage and turned off when the fourth driver circuit outputs the first power supply voltage.

4. The radio frequency module according to claim 2, wherein the first time period is less than 7 μs.

5. A radio frequency module comprising:
a power amplifier circuit for amplifying a transmission radio frequency signal and outputting an amplified signal to a transmission node;
a first transistor for coupling the transmission node to an antenna;
a second transistor for shunting the transmission node to a first power supply voltage;
a first power supply voltage generation circuit for generating a second power supply voltage higher than the first power supply voltage;
a second power supply voltage generation circuit for generating a third power supply voltage lower than the first power supply voltage;
a level shift circuit unit to which the second and third power supply voltages are supplied and which performs on-off control of the first and second transistors by applying a control signal having a value of the second power supply voltage or the third power supply voltage to the first and second transistors; and
a control circuit which switches a plurality of operation modes including a transmission operation mode, an isolation operation mode, and a power saving operation mode in accordance with an inputted first instruction and controls the level shift circuit unit and activation and deactivation of the first and second power supply voltage generation circuits in accordance with each operation mode,
wherein in the transmission operation mode, the control circuit activates the first and second power supply voltage generation circuits and the control circuit turns on the first transistor and turns off the second transistor through the level shift circuit unit, wherein in the isolation operation mode, the control circuit activates the first and second power supply voltage generation circuits and the control circuit turns off the first transistor and turns on the second transistor through the level shift circuit unit, wherein in the power saving operation mode, the control circuit deactivates the first and second power supply voltage generation circuits, and wherein when transition from the transmission operation mode to the power saving operation mode is instructed by the first instruction, the control circuit performs the isolation operation mode during a first time period after the transmission operation mode and then transitions to the power saving operation mode.

6. The radio frequency module according to claim 5,
wherein the first and second transistors are n-channel MIS transistors,
wherein the first power supply voltage is a ground voltage,
wherein the second power supply voltage is a positive power supply voltage, and
wherein the third power supply voltage is a negative power supply voltage.

7. The radio frequency module according to claim 6, wherein the second power supply voltage generation circuit generates the third power supply voltage, using the second power supply voltage.

8. The radio frequency module according to claim 7,
wherein the control circuit includes:
a detection circuit for detecting the first instruction indicating transition to the power saving operation mode; and
a delay circuit for delaying a detection signal from the detection circuit by the first time period, and
wherein activation and deactivation of the first power supply voltage generation circuit is controlled based on an output signal from the delay circuit.

9. The radio frequency module according to claim 8, wherein the delay circuit sets the first time period using a time constant of a resistance and a capacitance.

10. The radio frequency module according to claim 8, wherein the first time period is less than 7 μs.

11. The radio frequency module according to claim 6,
wherein the level shift circuit unit includes:
a first driver circuit which operates between the second power supply voltage and the first power supply voltage;
a second driver circuit which operates between the first power supply voltage and the third power supply voltage;
a first switch circuit which is inserted between an output node of the first driver circuit and a control input node of the first transistor and which is turned on when the first driver circuit outputs the second power supply voltage and turned off when the first driver circuit outputs the first power supply voltage;
a second switch circuit which is inserted between an output node of the second driver circuit and the control input node of the first transistor and which is turned on when the second driver circuit outputs the third power supply voltage and turned off when the second driver circuit outputs the first power supply voltage;
a third driver circuit which operates between the second power supply voltage and the first power supply voltage;
a fourth driver circuit which operates between the first power supply voltage and the third power supply voltage,
a third switch circuit which is inserted between an output node of the third driver circuit and a control input node of the second transistor and which is turned on when the third driver circuit outputs the second power supply voltage and turned off when the third driver circuit outputs the first power supply voltage; and
a fourth switch circuit which is inserted between an output node of the fourth driver circuit and the control input node of the second transistor and which is turned on when the fourth driver circuit outputs the third power supply voltage and turned off when the fourth driver circuit outputs the first power supply voltage.

12. The radio frequency module according to claim 11,
wherein the first switch circuit is a p-channel MIS transistor having a gate to which the first power supply voltage is applied and a source coupled to an output node of the first driver circuit,
wherein the second switch circuit is an n-channel MIS transistor having a gate to which the first power supply voltage is applied and a source coupled to an output node of the second driver circuit,
wherein the third switch circuit is a p-channel MIS transistor having a gate to which the first power supply voltage is applied and a source coupled to an output node of the third driver circuit,
wherein the fourth switch circuit is an n-channel MIS transistor having a gate to which the first power supply voltage is applied and a source coupled to an output node of the fourth driver circuit,
wherein transistors configuring the first to fourth switch circuits have characteristics of an enhancement type, and
wherein the first and second transistors have characteristics of a depression type.

13. A radio frequency module comprising:
a wiring board;
a first semiconductor chip which is mounted over the wiring board; and
a second semiconductor chip which is mounted over the wiring board and formed of an SOI substrate,
wherein the first semiconductor chip includes:
a bias circuit for generating a bias;
a power amplifier circuit for amplifying an inputted transmission radio frequency signal with a gain corresponding to the bias and outputting an amplified signal to a transmission node;
a first power supply voltage generation circuit for generating a positive power supply voltage; and
a control circuit which switches a plurality of operation modes including a transmission operation mode, an isolation operation mode, and a power saving operation mode in accordance with an inputted first instruction, outputs a first control signal corresponding to each operation mode, and controls activation and deactivation of the first power supply voltage generation circuit,
wherein the second semiconductor chip includes:
a first transistor for coupling the transmission node to an antenna;
a second transistor for shunting the transmission node to a ground voltage;
a third transistor for sending a reception radio frequency signal received by the antenna to a reception node;
a fourth transistor for shunting the reception node to the ground voltage;
a second power supply voltage generation circuit for generating a negative power supply voltage, using the positive power supply voltage; and
a level shift circuit unit to which the positive power supply voltage and the negative power supply voltage are supplied and which performs on-off control of the first to fourth transistors by applying a second control signal having a value of the positive power supply voltage or the negative power supply voltage to the first to fourth transistors in accordance with the first control signal, wherein in the transmission operation mode, the control circuit activates the first power supply voltage generation circuit and outputs the first control signal having first logic information, wherein in the isolation operation mode, the control circuit activates the first power supply voltage generation circuit and outputs the first control signal having second logic information, wherein in the power saving operation mode, the control circuit deactivates the first power supply voltage generation circuit and outputs the first control signal having third logic information, wherein the level shift circuit unit turns on the first and fourth transistors and turns off the second and third transistors in accordance with the first logic information, wherein the level shift circuit unit turns off the first and third transistors and turns on the second and fourth transistors in accordance with the second logic information, and wherein when transition from the transmission operation mode to the power saving operation mode is instructed by the first instruction, the control circuit performs the isolation operation mode during a first time period after the transmission operation mode and then transitions to the power saving operation mode.

14. The radio frequency module according to claim 13, wherein when transition to the power saving operation mode is instructed by the first instruction, the bias circuit stops generation of the bias.

15. The radio frequency module according to claim 14, wherein the first power supply voltage generation circuit generates the positive power supply voltage using an amplifier circuit of a negative-feedback configuration, and wherein the second power supply voltage generation circuit generates the negative power supply voltage by storing electric charge in a first capacitor using a clock signal generated by the positive power supply voltage.

16. The radio frequency module according to claim 15, wherein the control circuit includes:
a detection circuit for detecting the first instruction indicating transition to the power saving operation mode; and
a delay circuit for delaying a detection signal from the detection circuit by the first time period, and
wherein activation and deactivation of the first power supply voltage generation circuit is controlled based on an output signal from the delay circuit.

17. The radio frequency module according to claim 16, wherein the delay circuit sets the first time period using a time constant of a resistance and a capacitance.

18. The radio frequency module according to claim 14, wherein the level shift circuit unit includes:
a first driver circuit which operates between the positive power supply voltage and the ground voltage;
a second driver circuit which operates between the ground voltage and the negative power supply voltage;
a first switch circuit which is inserted between an output node of the first driver circuit and a control input node of the first transistor and which is turned on when the first driver circuit outputs the positive power supply voltage and turned off when the first driver circuit outputs the ground voltage;
a second switch circuit which is inserted between an output node of the second driver circuit and the control input node of the first transistor and which is turned on when the second driver circuit outputs the negative power supply voltage and turned off when the second driver circuit outputs the ground voltage;
a third driver circuit which operates between the positive power supply voltage and the ground voltage;
a fourth driver circuit which operates between the ground voltage and the negative power supply voltage;
a third switch circuit which is inserted between an output node of the third driver circuit and a control input node of the second transistor and which is turned on when the third driver circuit outputs the positive power supply voltage and turned off when the third driver circuit outputs the ground voltage; and
a fourth switch circuit which is inserted between an output node of the fourth driver circuit and the control input node of the second transistor and which is turned on when the fourth driver circuit outputs the negative power supply voltage and turned off when the fourth driver circuit outputs the ground voltage.

19. The radio frequency module according to claim 18, wherein the first switch circuit is a p-channel MIS transistor having a gate to which the ground voltage is applied and a source coupled to an output node of the first driver circuit,
wherein the second switch circuit is an n-channel MIS transistor having a gate to which the ground voltage is applied and a source coupled to an output node of the second driver circuit,
wherein the third switch circuit is a p-channel MIS transistor having a gate to which the ground voltage is applied and a source coupled to an output node of the third driver circuit,
wherein the fourth switch circuit is an n-channel MIS transistor having a gate to which the ground voltage is applied and a source coupled to an output node of the fourth driver circuit,
wherein transistors configuring the first to fourth switch circuits have characteristics of an enhancement type, and
wherein the first and second transistors are n-channel MIS transistors having characteristics of a depression type.

20. A radio frequency module configured enter a power saving operation mode from a transmission operation mode via an isolation operation mode in response to a first instruction, the radio frequency module comprising:
a transmission node;
a first transistor for coupling the transmission node to an antenna;
a second transistor for shunting the transmission node to a first power supply voltage; and
circuitry configured to:
when in the transmission operation mode, provide a second power supply voltage and a third power supply voltage and apply a control signal corresponding to the second power supply voltage or the third power supply voltage to each of the first and second transistors so as to turn on the first transistor and turn off the second transistor;
in response to a first instruction to enter the power saving mode from the transmission operation mode, turn off the first transistor and turn on the second transistor for a first predetermined period of time during an isolation operation mode; and after the first predetermined period of time, discontinue providing the second and third power supply voltages.

21. The radio frequency module according to claim 20, wherein the circuitry includes a level shift circuit unit comprising:

first and second switch circuits configured to operate complementarily and having output ends connected to a control input node of the first transistor;

third and fourth switch circuits configured to operate complementarily and having output ends connected to a control input node of the second transistor.

22. The radio frequency module according to claim 21, wherein:

the level shift circuit unit further comprises:

first and second driver circuits having outputs coupled to input ends of respective first and second switch circuits; and third and fourth driver circuits having outputs coupled to input ends of respective third and fourth switch circuits;

when in the transmission operation mode, the second power supply voltage is provided to the first and third driver circuits and the third power supply voltage is provided to the second and fourth driver circuit; and after the first predetermined period of time, the second and third power supply voltages are no longer provided to any of the driver circuits.

* * * * *